US006949788B2

(12) United States Patent
Fujiwara et al.

(10) Patent No.: US 6,949,788 B2
(45) Date of Patent: Sep. 27, 2005

(54) NONVOLATILE SEMICONDUCTOR MEMORY DEVICE AND METHOD FOR OPERATING THE SAME

(75) Inventors: Ichiro Fujiwara, Kanagawa (JP); Toshio Kobayashi, Kanagawa (JP)

(73) Assignee: Sony Corporation (JP)

( * ) Notice: Subject to any disclaimer, the term of this patent is extended or adjusted under 35 U.S.C. 154(b) by 931 days.

(21) Appl. No.: 09/735,903

(22) Filed: Dec. 14, 2000

(65) Prior Publication Data

US 2004/0070020 A1 Apr. 15, 2004

(30) Foreign Application Priority Data

Dec. 17, 1999 (JP) .......................................... 11-359897
Jun. 12, 2000 (JP) ...................................... 2000-180762

(51) Int. Cl.[7] ................................................ H01L 21/82

(52) U.S. Cl. ....................... 257/314; 257/315; 257/316; 257/317; 257/318; 257/319; 257/320; 257/321; 257/324; 438/201; 438/211; 438/128; 438/262

(58) Field of Search ................................ 257/314, 315, 257/318, 324, 216, 39, 316, 312, 319, 320, 321; 438/201, 211, 128, 212

(56) References Cited

U.S. PATENT DOCUMENTS 6,005,270 A * 12/1999 Noguchi ..................... 257/315
6,160,297 A * 12/2000 Shimizu et al. ............. 257/390
6,313,501 B1 * 11/2001 Kwon ........................ 257/317
6,649,972 B2 * 11/2003 Eitan .......................... 257/324
2001/0013621 A1 * 8/2001 Nakazato .................... 257/314

* cited by examiner

*Primary Examiner*—Nathan J. Flynn
*Assistant Examiner*—Fazli Erdem
(74) *Attorney, Agent, or Firm*—Rader, Fishman & Grauer PLLC; Ronald P. Kananen

(57) ABSTRACT

A nonvolatile semiconductor memory device having MONOS type memory cells of increased efficiency by hot electron injection and improved scaling characteristics includes a channel forming region in the vicinity of a surface of a substrate, first and second impurity regions, acting as a source and a drain in operation, formed in the vicinity of the surface of the substrate sandwiching the channel forming region between them, a gate insulating film stacked on the channel forming region and having a plurality of films, and a charge storing means that is formed in the gate insulating film dispersed in the plane facing the channel forming region. A bottom insulating film includes a dielectric film that exhibits a FN type electroconductivity and makes the energy barrier between the bottom insulating film and the substrate lower than that between silicon dioxide and silicon.

30 Claims, 16 Drawing Sheets

SI-H BOND DENSITY AND N-H BOND DENSITY CALCULATED FROM THE FTIR SPECTRA

| | Si-H | N-H |
|---|---|---|
| DCS | $1.6\times10^{21}$ atoms/mm$^3$ | $9.0\times10^{21}$ atoms/mm$^3$ |
| TCS | $1.1\times10^{20}$ atoms/mm$^3$ | $1.3\times10^{22}$ atoms/mm$^3$ |

NONVOLATILE SEMICONDUCTOR MEMORY DEVICE AND METHOD FOR OPERATING THE SAME

BACKGROUND OF THE INVENTION

1. Field of the Invention

The present invention relates to a nonvolatile semiconductor memory device which has a planarly dispersed charge storing means (for example, in a MONOS type or a MNOS type, charge traps in a nitride film, charge traps near the interface between a top insulating film and the nitride film, small particle conductors, etc.) in a gate insulating film between a channel forming region and a gate electrode in a memory transistor and is operated to electrically inject primarily channel hot electrons, ballistic hot electrons, secondarily generated hot electrons, substrate hot electrons, and hot electrons caused by band-to-band tunneling current into the charge storing means to store the same therein and to extract the same therefrom and a method for operating the device.

2. Description of the Related Art

Nonvolatile semiconductor memories offer promise as large capacity, small size data-storage media. Along with the recent spread of broadband information networks, however, write speeds equivalent to the transmission rates of the networks (for example, a carrier frequency of 100 MHZ) are being demanded. Therefore, nonvolatile memories are being required to have good scaling and be improved in write speed to one or more order of magnitude higher than the conventional write speed of 100 μs/cell.

As nonvolatile semiconductor memories, in addition to the floating gate (FG) types wherein the charge storing means (floating gate) that holds the charge is planarly continuously spread in a plane, there are known MONOS (metal-oxide-nitride-oxide-semiconductor) types wherein the charge storing means are planarly dispersed.

In a MONOS type nonvolatile semiconductor memory, since the carrier traps in the nitride film [$Si_xN_y$ ($0<x<1$, $0<y<1$)] or on the interface between the top oxide film and the nitride film, which are the main charge-retaining bodies, are spatially (that is, in the planar direction and thickness direction) dispersed, the charge retention characteristic depends on not only the thickness of a tunneling insulating film, but also on the energy and spatial distribution of the charge captured by the carrier traps in the $Si_xN_y$ film.

When a leakage current path in locally generated in the tunneling insulating film, in an FG type, a large amount of charge easily leaks out through the leakage path and the charge retention characteristic declines. On the other hand, in an MONOS type, since the charge storing means is spatially dispersed, only the charges near the leakage path will locally leak from it, therefore the charge retention characteristic of the entire memory device will not decline much.

As a result, in a MONOS type, the disadvantage of the degradation of the charge retention characteristic due to the reduction in thickness of the tunnel insulating film is not so serious as in an FG type. Accordingly, a MONOS type is superior to an FG type in scaling of a tunneling insulating film in a miniaturized memory transistor with an extremely small gate length.

Moreover, when a charge is locally injected into the plane of distribution of the planarly dispersed charge traps, the charge is held without diffusing in the plane and in the thickness direction, the contrary to an FG type.

To realize a miniaturized memory cell in a MONOS type nonvolatile semiconductor memory, it is important to improve the disturbance characteristic. Therefore, it is necessary to set the tunneling insulating film thicker than the normal thickness of 1.6 nm to 2.0 nm. When the tunneling insulating film is formed relatively thick, the write speed is in the range of 0.1 to 10 ms, which is still not sufficient.

In other words, in a conventional MONOS type nonvolatile semiconductor memory etc., to fully satisfy the requirements of reliability (for example, data retention, read disturbance, data rewrite, etc.), the write speed is limited to 100 μs.

A high speed is possible if the write speed alone is considered, but sufficiently high reliability and low voltages cannot be achieved. For example, a source-side injection type MONOS transistor has been reported wherein the channel hot electrons (CHE) are injected from the source side (*IEEE Electron Device Letter,* 19, 1998, p. 153). In this source-side injection type MONOS transistor, in addition to the high operation voltages of 12V for write operations and 14V for erasure operations, the read disturbance, data rewrite, and other facets of reliability are not sufficient.

On the other hand, taking note of the fact that it is possible to inject a charge into part of dispersed charge traps area by the conventional CHE injection method, it has been reported that by independently writing binary data into the source and drain side of a charge storing means, it is possible to record 2 bits of data in one memory cell. For example, *Extended Abstract of the* 1999 *International Conference on Solid State Devices and Materials,* Tokyo, 1999, pp 522–523, considers that by changing the direction of the voltage applied between the source and drain to write 2 bits of data by injecting CHE and, when reading data, applying a specified voltage with a direction reversed to that for writing. By the so-called "reverse read" method, correct reading of the 2 bits of data is possible even if the write time is short and the amount of the stored charge in small. Erasure is achieved by injecting hot holes.

By using this technique, it becomes possible to increase the write speed and largely reduce the cost per bit.

However, in a conventional CHE injection type MONOS type nonvolatile semiconductor memory, since Electrons are accelerated in the channel to produce high energy electrons (hot electrons), it is necessary to apply a voltage of about 4.5V between the source and drain, and it in difficult to decrease this source-drain voltage. As a result, in a write operation, the punch-through effect becomes a restriction and good scaling of the gate length is difficult.

SUMMARY OF THE INVENTION

An object of the present invention is to provide a nonvolatile semiconductor memory device, wherein the punch-through is well suppressed, which occurs when performing scaling of gate length at high write speeds achieved by injecting hot electrons into a charge storing means such as planarly dispersed carrier traps, and scaling of gate length and thickness of the gate insulating film is good, and a method of operating the device.

According to the first aspect of the present invention, there is provided a nonvolatile semiconductor memory device comprising a substrate, a semiconductor channel forming region of a semiconductor in the vicinity of the surface of the substrate, a first and a second impurity regions formed in the vicinity of the surface of the substrate sandwiching the channel forming region between them, acting as a source and a drain in operation, a gate insulating film stacked on the channel forming region and comprised of a plurality of films, a gate electrode formed on the gate insulating film, a charge storing means which is formed in the gate insulating film dispersed in the plane facing the channel forming region and in the direction of thickness and is injected with excited hot electrons in operation due to an electric field applied. In the same device, a bottom insulating film at the bottom of the gate insulating film comprises a dielectric film that makes an energy barrier between the bottom insulating film and the substrate lower than that between silicon dioxide and silicon.

The bottom film comprising a dielectric film that makes an energy barrier between the bottom insulating film and the substrate lower than that between silicon and an oxynitride film formed after silicon dioxide is nitrided. Here, preferably, the percentage of nitrogen content in the oxynitride film is not greater 10%.

In addition, in a write or erasure state, the charge storing means may be primarily injected with anyone of channel hot electrons, ballistic hot electrons, secondarily generated hot electrons, substrate hot electrons, and hot electrons caused by band-to-band tunneling current.

The dielectric film may exhibit a Fowler-Nordheim (FN) type tunneling electroconductivity. In addition, the dielectric film is comprised of, as a preferable film material, anyone or a combination of silicon nitride, silicon oxynitride, tantalum oxide, zirconium oxide, aluminum oxide, titanium oxide, hafnium oxide, barium strontium titanium oxide, and yttrium oxide. If silicon oxynitride is used, the percentage of nitrogen content is above 10%.

Preferably, an films included in the gate insulating film, there is provided a nitride film or an oxynitride film exhibiting a Frenkel-Pool (FP) type electroconductivity on the bottom insulating film.

Note that, comparing with an insulating film exhibiting an FP tunneling electroconductivity, one characteristic of an insulating film exhibiting an FN tunneling electroconductivity is that the amount of carrier traps in the insulating material is largely reduced.

The gate insulating film, comprises a first region into which hot electrons are injected from the first impurity region, a second region into which hot electrons are injected from the second impurity region, and a third region between the first and the second regions into which hot electrons are not injected.

Alternatively, the charge storage means may be formed in the first and the second regions and the distribution region of the charge storing means may be spatially separated by the third region.

In the latter case, for example, the first and the second regions are stacked film structures comprised of a number of films stacked together, and the third region is a single layer of a dielectric. In addition, a gate electrode formed on the third region is spatially separated from the gate electrodes formed on the first region and the second regions.

In the present nonvolatile semiconductor memory device, a separated source line type, virtual grounding type, or other NOR type cell array structure wherein a common line connected to the first impurity regions (for example, drain impurity regions) and a common line connected to the second impurity regions (for example, source impurity regions) can be controlled independently is preferable.

In a separated source line type, a common line connected to the first impurity regions is referred to as a first common line, while that connected to the second impurity regions is referred to as a second common line.

In this case, the first and second common lines may have a hierarchical structure. In a so-called AND type cell array, memory transistors are connected in parallel to the first and the second sub-lines that are used as the inner interconnections in a memory block.

In addition, an the memory transistors, use may be made of various kinds of memory transistors having charge storing means planarly dispersed in a plane and in the direction of thickness, such as so-called MONOS type, nanocrystal type, etc. In addition, in the present invention, for example, when the bottom film thicker, an intermediate nitride film or oxynitride film may be omitted. In thin case, in order to reduce the density of surface states on the semiconductor surface, it is desired to place a thin buffer oxide film between the channel forming region and the bottom insulating film.

According to the second aspect of the present invention, there is provided a nonvolatile semiconductor memory device comprising a substrate, a semiconductor channel forming region of a semiconductor in the vicinity of the surface of the substrate, a first and a second impurity regions formed in the vicinity of the surface of the substrate sandwiching the channel forming region between them, acting as a source and a drain in operation, a gate insulating film stacked on the channel forming region and comprised of a plurality of films, a gate electrode formed on the gate insulating film, a charge storing means which is formed in the gate insulating film dispersed in the plane facing the channel forming region and in the direction of thickness and is primarily injected in operation with channel hot electrons, ballistic hot electrons, secondarily generated hot electrons, substrate hot electrons, and hot electrons caused by band-to-band tunneling current. A bottom insulating film positioned at the bottom in the gate insulating film is comprised of a dielectric film of a material having a dielectric constant greater than that of silicon dioxide.

The Si—H bond density in the bottom insulating film may be lower than that in the nitride film included in the gate insulating film and showing an FP type electroconductivity (for example, by more than one order of magnitude). For example, the Si—H bond density in the bottom insulating film is lower than $1\times10^{20}$ atms/mm$^3$.

According to the third aspect of the present invention, there is provided a nonvolatile semiconductor memory device comprising a substrate, a semiconductor channel forming region of a semiconductor in the vicinity of the surface of the substrate, a first and a second impurity regions formed in the vicinity of the surface of the substrate sandwiching the channel forming region between them, acting as a source and a drain in operation, a gate insulating film stacked on the channel forming region and comprised of a plurality of films, a gate electrode formed on the gate insulating film, a charge storing means which is formed in the gate insulating film dispersed in the plane facing the channel forming region and in the direction of thickness and is primarily injected in operation with channel hot electrons, ballistic hot electrons, secondarily generated hot electrons, substrate hot electrons, and hot electrons caused by band-to-band tunneling current. The gate insulating film comprises a first region at the side of the first impurity region, a second region at the side of the second impurity region, and a third region between the first and the second regions. The charge storage means is formed in the first and the second regions and the region of distribution of the charge storing means is spatially separated by the third region.

The first and second regions may be stacked film structures comprised of a number of films stacked together, and the third region may be a single layer of a dielectric.

According to the fourth aspect of the present invention, there is provided a method of operating a nonvolatile semiconductor memory device comprising a substrate, a semiconductor channel forming region of a semiconductor in the vicinity of the surface of the substrate, a first and a second impurity regions formed in the vicinity of the surface of the substrate sandwiching the channel forming region between them, acting as a source and a drain in operation, a gate insulating film stacked on the channel forming region comprising of a plurality of films, a gate electrode formed the gate insulating film, a charge storing means which is formed in the gate insulating film dispersed in the plane facing the channel forming region and in the direction of thickness and is primarily injected with hot electrons in operation. A bottom insulating film positioned at the bottom in the gate insulating film comprises a dielectric film that makes an energy barrier between the bottom insulating film and the substrate lower than that between silicon dioxide and silicon. In a write operation, the same method comprises a step of setting the voltage applied between the first and second impurity regions lower than that when the write speed is constant and the bottom insulating film is comprised of silicon dioxide.

Preferably, the voltage applied between the first and second impurity regions is set to be not higher than 3.3 V.

Further preferably, the voltage is set to be lower than an energy barrier between silicon dioxide and the substrate at the side of conduction bands.

In operations of writing a plurality of bits of data, preferably, reverse the application conditions of the bias voltage to the first and second impurity regions and perform a write operation again to inject hot electrons into the charge storing means from either the side of the first or the side of the second impurity regions, that is, opposite to the side in the write operation.

In the distribution plane of the charge storing means facing the channel forming region, hot electrons injected from the first impurity region are localized and stored in the area at the side of the first impurity region.

When the application direction of the bias voltage to the first and second impurity regions is reversed and a write operation is performed in order to write a plurality of bits of data, in the distribution plane of the charge storing means facing the channel forming region, hot electrons injected from the second impurity region are localized and stored in the area at the side of the second impurity region. In this case, the two storing regions of hot electrons injected from the first and second impurity regions are separated in two areas inside the charge storing means along the channel direction, sandwiching an intermediate region into which hot electrons are not injected.

In a read operation, apply a specified read drain voltage between the first and second impurity regions so as to make the source to be the impurity region at the side of the charge storing means to be read, and apply a specified read gate voltage on the gate electrode.

In operations of reading a plurality of bits of data, read more than two bits of data that are based on the hot electrons injected from the first and second impurity regions by changing the application direction of voltages to the first and the second impurity regions.

In an erasure operation, extract the charge injected from the first impurity region and stored in the charge storing means to the side of the first impurity region by direct tunneling or FN tunneling. Alternatively, an erasure operation may also be performed by injecting hot holes caused by band-to-band tunneling current.

In operations of erasing a plurality of bits of data, extract simultaneously or separately the charge, which are injected from the first and second impurity regions and stored in two separated areas near the two ends of the charge storing means in the channel direction, to the side of the substrate by direct tunneling or the FN tunneling.

In the present nonvolatile semiconductor memory device and the method for operating the same, in a write operation, channel hot electrons, ballistic hot electrons, secondarily generated hot electrons, substrate hot electrons, or hot electrons caused by band-to-band tunneling current are injected into the charge storing means from the first and second impurity regions that serve as a source and a drain, or from the entire area of the channel. At this time, hot electrons surmount the energy barrier between the substrate comprised of a silicon wafer and the bottom insulting film at the bottom of the tunneling insulating film, and are injected. In the present invention, the energy barrier between the substrate and the bottom insulting film is lower than that between silicon dioxide and silicon. In addition, as the material of the bottom insulating film, especially the material of the dielectric film that makes the energy barrier of the bottom insulating film lower, for example, use may be made of materials exhibiting a Fowler-Nordheim (FN) type tunneling electroconductivity, such as nitride films of low traps. As a result, the energy barrier between the substrate and the bottom insulting film that hot electrons should surmount in reduced from the energy barrier of 3.2V between silicon and silicon dioxide, that is, the conventional dielectric material to, for example, 2.1V. Due to low energy barrier of the bottom insulating film, efficiency of charge injection is improved, and in turn the write drain voltage can be reduced to 3.3V or below. Although a buffer oxide film is placed between the channel forming region and the bottom insulating film, since this film is very thin, its influence on the energy barrier is negligible.

In addition, reduction of the write drain voltage may lead to the reduction of the average energy of hot electrons injected into the charge storing means, as a result, the damage to the bottom insulating film can be suppressed.

In a read operation, a read drain voltage is applied so as to make the source to be the impurity region at the side where the stored charge to be read are held. The presence of a stored charge at the side of the first or second impurity regions that has a higher voltage does not influence the channel electric field much at all, while the channel electric field changes influenced by the presence of a stored charge at the lower voltage side. Therefore, the threshold voltage of the memory transistor reflects the presence of a stored charge at the low voltage side.

In an erasure operation, for example, apply a positive voltage to the first or the second impurity region, and the stored charge held at the side of the source or the drain may be extracted to the substrate side by direct tunneling or the Fowler-Nordheim tunneling.

In addition, in an erasure operation, for example, apply a positive voltage to the first or the second impurity region. To the word line (gate electrode). Optionally, apply a negative voltage capable of causing inversion in the surface of the impurity region to which above positive voltage is applied. In this case, the inversion surface is deeply depleted, and band-to-band tunneling current is generated. The generated holes are accelerated by the electric fields and become hot holes and are injected into the charge storing means.

By either of the tunneling effects, it is possible to erase a block at once.

BRIEF DESCRIPTION OF THE DRAWINGS

These and other objects and features of the present invention will become clearer from the following description of the preferred embodiments given with reference to the accompanying drawings, in which.

DESCRIPTION OF THE PREFERRED EMBODIMENTS

Below, preferred embodiments will be described with reference to the accompanying drawings.

First Embodiment

The first embodiment relates to a virtual grounding NOR type nonvolatile semiconductor memory device.

Figure 1:
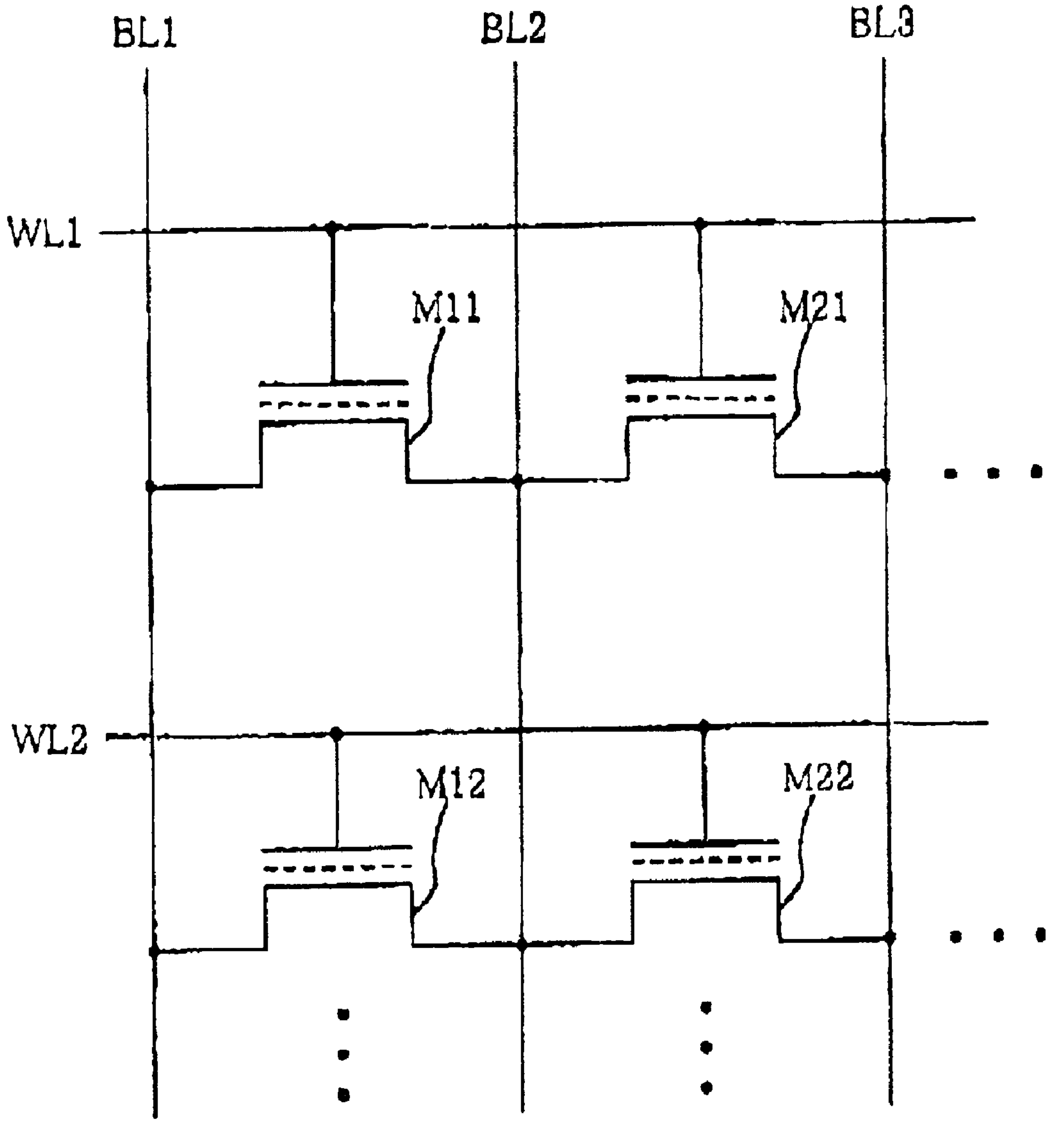
FIG. 1 is a circuit diagram of the configuration of a virtual grounding NOR type memory cell array of a nonvolatile semiconductor memory device according to the first and second embodiments of the present invention.

FIG. 1 is a circuit diagram of the configuration of a virtual grounding NOR type memory cell array.

In this memory cell array, each memory cell is comprised of a single memory transistor. For example, m×n memory transistors M11, M21, . . . , Mm1, M12, M22, . . . , M1n, . . . , Mmn are arranged like a matrix. Shown in FIG. 1 are only 2×2 memory transistors.

Each gate of memory transistors in one row is connected to the same word line. That is, in FIG. 1, gates of memory transistors belonging to the same row M11, M21, . . . , are connected to the word line WL1. While, gates of memory transistors belonging to the other row M12, M22, . . . , are connected to the word line WL2.

Each source of memory transistors is connected to the drain of a memory transistor adjacent at one side in the word direction. The drain of a memory transistor is connected to the source of the memory transistor adjacent in the other way in the word direction. These commonly connected sources and drains are connected to the common lines in the bit direction BL1, BL2, BL3, . . . . These common lines are operated to function as source lines on which a reference voltage is applied, when the memory transistors on one side whose sources and drains are commonly connected are turned on. While, when the memory transistors of the other side are turned on, these common lines are operated to function as bit lines on which the drain voltage is applied. Therefore, in this memory cell, all common lines in the bit line direction BL1, BL2, . . . are called bit lines.

Figure 2:
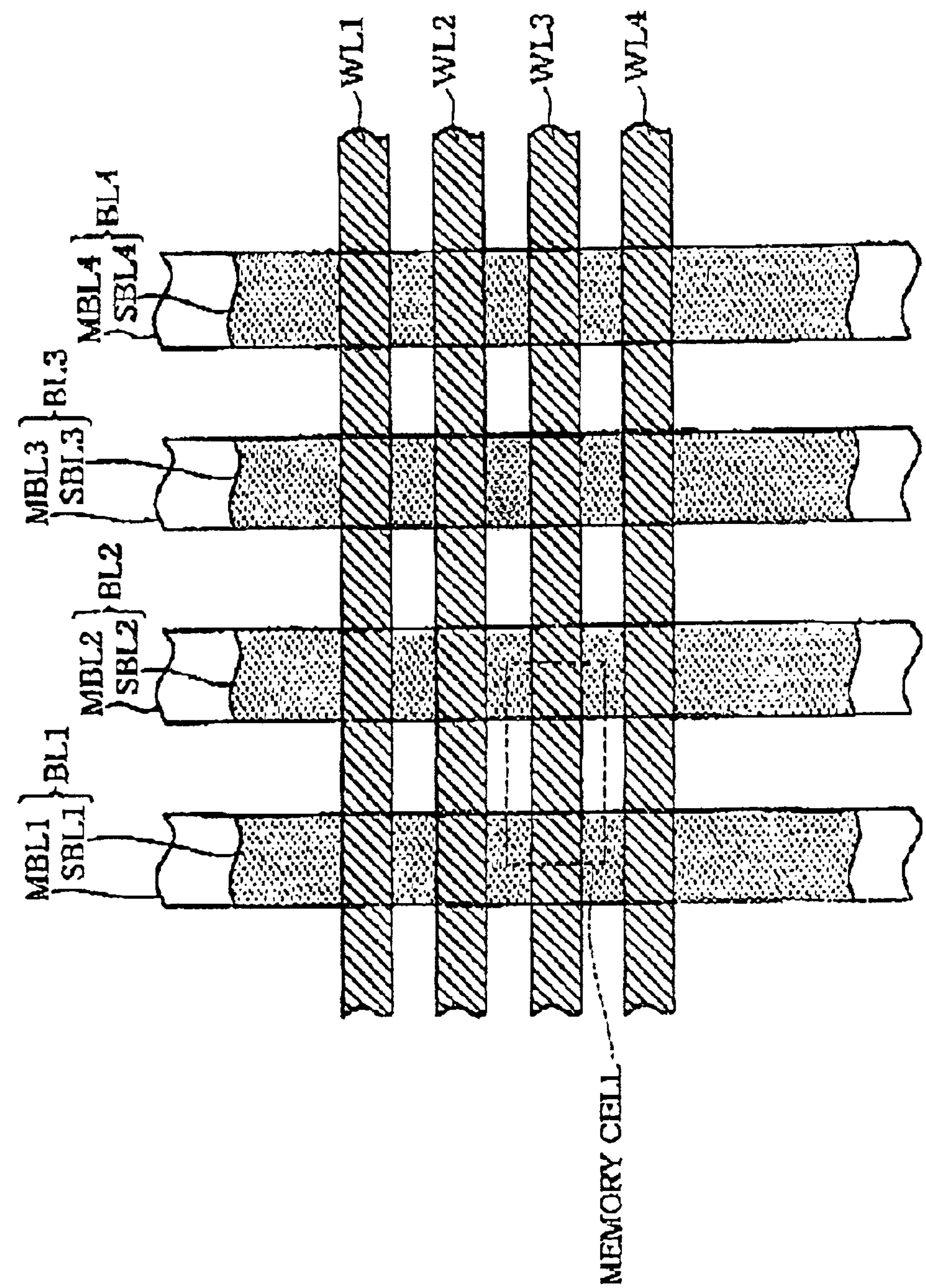
FIG. 2 is a plan view of a virtual grounding NOR type memory cell array according to the first, second and third embodiments of the present invention.

FIG. 2 is a plan view of 4×4 memory cells of the memory cell array.

Each bit line (BL1 to BL3) is comprised of a diffused connection layer formed from a semiconductor impurity region (sub-bit lines SBL1, SBL2, . . . ) and a metal connection (main bit lines MBL1, MBL2, . . . ) connected to a sub-bit line SBL1, SBL2, . . . through a not shown bit contact. The main bit lines MBL1, MBL2, . . . are arranged in parallel above the corresponding sub bit lines SBL1, SBL2, . . . , in parallel stripes as whole. Each of the word lines WL1, WL2 . . . are perpendicular with each of these bit lines and are arranged in parallel stripes.

In this pattern of the memory cell array, there is no element isolation layer ISO at all, thus the cell area is small. Note that one of every other sub-bit lines, for example, SBL1 and SBL3, may be connected to the upper layer metal interconnections through not shown bit contacts.

Figure 3:
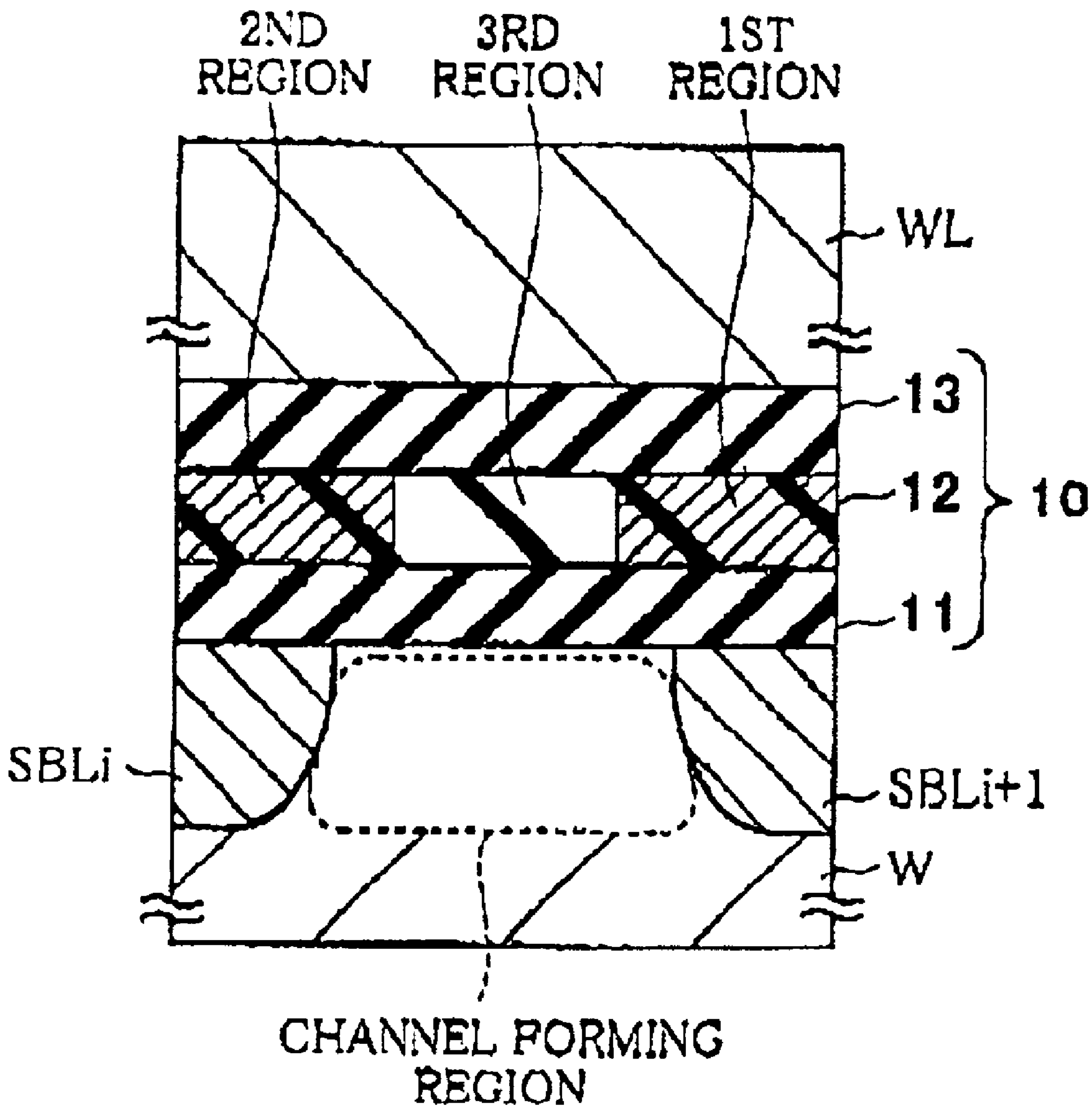
FIG. 3 is a cross-sectional view of a memory transistor according to the first, second and third embodiments of the present invention.

FIG. 3 shows the cross-sectional view of an n-channel MONOS memory transistor that forms each memory cell.

In FIG. 3, in the vicinity of the surface of a p-type silicon wafer serving as a semiconductor substrate SUB (or, p-well), an n-type impurity in added and diffused, and the sub-bit lines SBL and the sub-source lines are formed at a specified interval. The region sandwiched by a sub-bit line SBL and a sub-source line SSL and intersect with a word line WL is the channel forming region of this transistor.

Above the channel forming region, a gate electrode (word line WL) is stacked on a gate insulating film 10. Usually the word line WL is comprised of polycrystaline silicon that is made conductive by doping a p-type or n-type impurity at a high concentration (doped poly-Si) or of a stacked film of doped poly-Si and a refractory metal silicide. The effective part of the word line (WL), that in, the length equivalent to the source-drain distance in the channel direction (gate length) is below 0.25 $\mu$m, for example, 0.18 $\mu$m.

The gate insulating film 10 consists of a bottom insulating film 11, a nitride film 12, and a top insulating film 13 in order from the bottom.

For the bottom film 11, a nitride film or a silicon oxynitride film that shows an FN tunneling electroconductivity (FN tunneling nitride film) may be used. The FN tunneling nitride film, for example, may be a silicon nitride film or a film mainly comprised of silicon nitride (for example, silicon oxynitride film) fabricated by JVD (Jet Vapor Deposition), or by heating a CVD film in an atmosphere of a reducing or oxidizing gas to cause transformations (hereinafter, refer to is as 'thermal FN tunneling method').

A silicon nitride film fabricated by the normal CVD method exhibits a Frenkel-Pool (PF) type Electroconductivity, in contrast, the FN tunnel nitride film exhibits a Fowler-Nordheim (FN) type electroconductivity because the number of carrier traps in the film is smaller than in a film fabricated by the normal CVD method.

The thickness of the bottom film (FN tunneling nitride film) 11 can be selected in the range from 2.0 nm to 6.0 nm corresponding to the application. Here, it is set to be 4.0 nm.

The nitride film 12 is comprised of, for example, a silicon nitride [$Si_xN_y$ (0<x<1, 0<y<1)] film that is 5.0 to 8.0 nm in thickness. A small amount of oxygen may be doped into the silicon nitride film exhibiting a FP type electroconductivity. The nitride film 12 in fabricated, for example, by low pressure chemical vapor deposition (LP-CVD) and includes a large number of carrier traps. The nitride film 12 exhibits a Frenkel-Pool type (FP type) electroconductivity.

The top insulating film 13 is formed by thermally oxidizing a formed nitride film since it in necessary to form deep carrier traps at a high density near the interface with the nitride film 12. Alternatively, an $SiO_2$ film formed by high temperature chemical vapor deposited oxide (HTO) may also be used as the top insulating film 13. When the top insulating film 13 is formed by CVD, the traps are formed by heat treatment. The thickness of the top insulating film 13 must be greater than 3.0 nm, preferably over 3.5 nm, in order to effectively block the injection of holes from the gate electrode (word line WL) and prevent a reduction of the number of data write-erasure cycles.

In the fabrication of memory transistors of this structure, first, p-wells are formed in the surface of a prepared semiconductor substrate SUB, then the impurity regions forming the sub-bit lines and the sub-source lines are formed by ion implantation. If necessary, ion implantation is performed for adjustment of the threshold voltage.

Next, the gate insulating film 10 is formed on the surface of the semiconductor substrate SUB.

In more detail, first, the bottom insulating film 11 is formed by JVD or the thermal FN tunneling method to, for example, a thickness of about 4 nm.

In JVD, silicon and nitrogen molecules or atoms are emitted from a nozzle to the vacuum at extremely high speeds, the current of these high speed molecules or atoms is guided to the semiconductor substrate SUB, and for example, the silicon oxynitride film is deposited.

In the thermal FN tunneling method, first, as the process prior to the fabrication of the bottom insulating film 11, the semiconductor substrate SUB is processed by heat treatment in an NO atmosphere at a furnace temperature of 800° C. for 20 seconds. Next, for example, a silicon nitride film is deposited by LP-CVD. Then, this CVD film is processed by heat treatment in an ammonia ($NH_3$) atmosphere at a furnace temperature of 950° C. for 30 seconds. Following that, heat treatment is performed in an atmosphere of $N_2O$ at a furnace temperature of 800° C. for 30 seconds, the SiN film that shows an FP electroconductivity after the formation of the CVD film is transformed to an FN tunneling nitride film.

Next, a silicon nitride film (nitride insulating film 12) is deposited on the bottom film 11 by LP-CVD to a final thickness of 5 nm. This LP-CVD is performed using as a feedstock gas, for example, a mixture comprised of dichlorosilane (DCS) and ammonia at a substrate temperature of 730° C. Here, when necessary, optimization of pre-treatments of the underlying surface (wafer pre-treatment) and the conditions of film formation may be performed in order to suppress the increase of the roughness of the surface of the completed film. In this case, without the optimization of wafer pre-treatment, the morphology of the nitride film surface in poor, and a precise measurement of film thickness is impossible. So, this wafer pre-treatment should be well optimized, then in the following thermal oxidization process, the setting of film thickness is performed by considering the reduction of the nitride film thickness considered.

The surface of the formed nitride film is then oxidized by thermal oxidization to form the top insulating film of, for example, 3.5 nm. This thermal oxidation in performed, for example, in an $H_2O$ atmosphere at a furnace temperature of 950° C. In this way, deep carrier traps with a trap level (energy difference from conduction band of silicon nitride film) not greater than 2.0 eV or so are formed at a density of about 1 to $2\times10^{13}/cm^2$ on the interface of the top insulating film and the nitride film. The thermal oxidized silicon film (top insulating film 13) is formed to a thickness of 1.6 nm with respect to a nitride film 12 of 1 nm, The thickness of the underlying nitride film is reduced according to this proportion, so the final thickness of the nitride film 12 becomes 5 nm.

A conductive film forming the gate electrodes (word lines WL) are stacked, then this conductive film and the gate insulating film are processed simultaneously to the same pattern.

Next, the interlayer insulating film are formed, if necessary, bit contacts are formed, and after the main bit lines are formed on the intarlayer insulating film, the overcoat film is formed, and pads are opened, thereby completing the nonvolatile memory cell array.

If the bottom insulating film in the ONO film (bottom insulating film/nitride film/top insulating film) of a MONOS type nonvolatile memory transistor is set to be about 4 nm in thickness, the film thickness specifications of the ONO film used so far typically took values of 4.0/5.0/3.5 nm. The equivalent thickness of a silicon dioxide film converted from this ONO film thickness is 10 nm.

Next, an example of setting the bias and the operation of a nonvolatile memory of such a configuration will be explained using as an example the operation of writing two bite of data to a memory transistor M11.

Write operations are performed, for example, by using channel hot electron injection. When writing two bits of data, as shown in FIG. 3, the gate insulating film 10 of a memory transistor is partitioned into the first region at the aide of the sub-bit line SBLi+1, the second region at the side of the sub-bit line SBLi, and the third region between the above first and second regions. Hot electrons generated at the side of the sub-bit line SBLi+1 are injected into the first region, and hot electrons generated at the side of the sub-bit line SBLi are injected into the second region, while no hot electrons are injected into the third region between them.

When writing data to a memory transistor M21, for example, apply a voltage of 3.3V to a metal connection that in connected to the selected bit line BL3, and a voltage of 0V to the bit line BL2 that functions as the source line. Apply 5V to the selected word line WL1, and 0V to the nonselected word line WL2 and a metal connection that is connected to the nonselected bit line BL1. Due to these actions, the voltage of 3.3V is applied between the source and drain of memory transistor M21, therefore, electrons are supplied from the source impurity region (sub-bit line SBL2), and are accelerated by electric fields. The accelerated electrons become hot electrons near the end of the channel in the horizontal direction, part of them surmount the energy barrier with the bottom insulating film 11, and are injected into the carrier traps in the first region inside the gate insulating film 10.

On the other hand, in an operation of writing data to the opposite side, i.e., a local place of the charge forming region of memory transistor M21 at the side of the bit line BL2 (second region), reverse the application direction of the voltage between source and drain with respect to the above write operation, the rest voltage conditions are the same. Therefore, by channel hot electron injection, charges are injected into the second region of the distribution region of the charge storing means of memory transistor M21 at the side of the bit line BL2.

In a read operation, make source to be the side where the charge to be read in memory transistor M21 is stored (e.g., the side of bit line BL3), and drain to be the bit line BL2, and apply a specified read drain voltage between the source and drain. In addition, apply a specified read gate voltage to the word line WL1. At this time, in order that the not shown memory transistor M31, the next right neighbor of memory transistor M21 is not turned on, potential of the not shown bit line BL4, the further next right neighbor, should be properly adjusted. In this way, a potential change related to the threshold voltage of memory transistor M21 appears on the bit line BL3, and is detected by a sense amplifiers.

When reading charge from the opposite side, by reversing the application direction of the voltage between source and drain, similar read operation is possible.

Erasure is performed by extracting charge from the entire channel, or, the side of the sub-bit line SBL by FN tunneling or direct tunneling.

For example, in the cane of extracting electrons held in the charge storing means to the entire channel region by direct tunneling, apply −5V to all word lines WL1, WL2, . . . , and for example, applying 5V to odd-numbered bit lines BL1, BL3, . . . , and met open the even-numbered bit lines BL2, BL4, . . . , and apply 5V to the p-well W. In this way, with electrons hold in the first region of the charge storing means extracted to the substrate side, erasure of a cell is performed. Here, the erasure speed is about 1 ms. Erasure of the second region may be realized by exchanging the voltage setting for odd-numbered and even-numbered the bit lines. When erasing both the first and second regions at one time, all bit-lines are set to be at the same potential of 5V.

Erasure may also be performed by injecting hot holes caused by band-to-band tunneling current.

For example, with the well W maintained at 0V, apply a specified negative voltage of, say, −6V, to all word lines WL, and a specified positive voltage of, say, 6V, to all sub-bit lines SBL, As a result, the surface of the n-type impurity region acting as the sub-bit lines SBL is deeply depleted and the energy bands bend sharply. Because of the band-to-band tunneling effect, electrons in the valence band tunnel to the conduction band and flow in the n-type impurity region, resulting in generation of holes. Those holes drift more or less to the center of the channel forming region and are accelerated by the electric field there, whereby part become hot holes. These hot holes generated at an edge of n-type impurity region are injected into the carrier traps formed as the charge storing means with a high efficiency, and are recombined with electrons held there. When holes are injected, the memory transistor is transferred to erasure state.

In a conventional MONOS type memory transistor using an oxide film as the bottom insulating film, it was needed to apply a voltage of about 4.5V between the source and drain during the channel hot electrons. It was difficult to achieve a write speed as high as 1 μs by decreasing this source-drain voltage. If scaling of gate length is performed under this condition, operation of memory cells is difficult because of the punch-through taking place between the source and drain, this is an important factor interfering with scaling of gate length.

Figure 4:
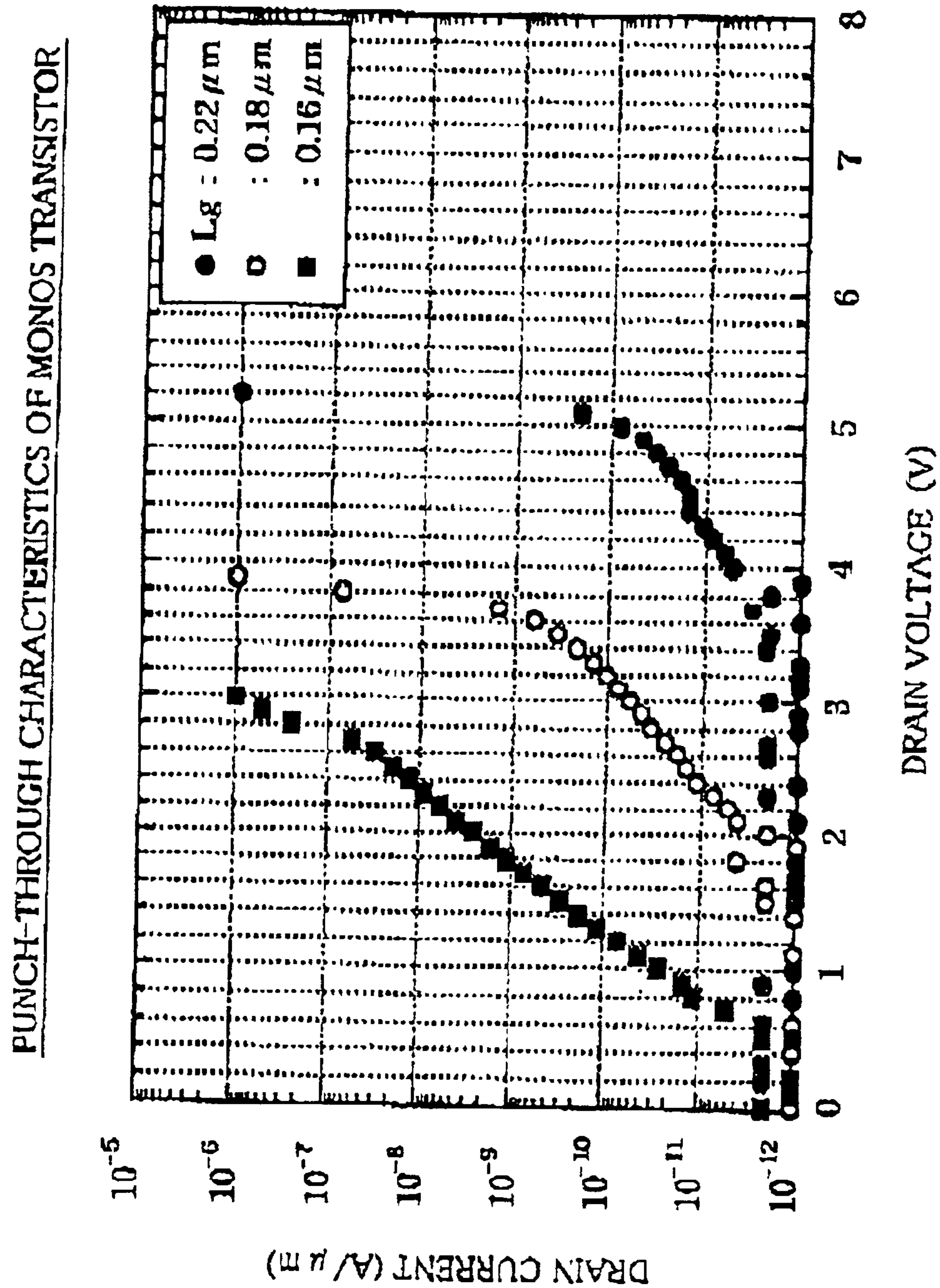
FIG. 4 is a graph showing the dependence of the punch-through effect on the gate length in a conventional MONOS type memory transistor; this graph is used to explain the effect of a memory transistor according to the first embodiment of the present invention.

FIG. 4 shows the dependence of the punch-through on gate length in a conventional MONOS type memory transistor using an oxide film as the bottom insulating film.

Assume the maximum permitted the drain current with respect to a unit gate width is about 500 pA/μm. Conventionally, with the gate length to be 0.22 μm, only a drain voltage of not greater than 5V can be applied. In addition, with the gate length to be 0.18 μm, the maximum value of the applicable drain voltage is about 3.6V.

In contrast, in the present embodiment, since the bottom insulating film is comprised of an FN tunneling nitride film, as described previously, the energy barrier between silicon and the bottom insulting film 11 that hot electrons should surmount is reduced from 3.2V to 2.1V. Therefore efficiency of hot electron injection is improved, and the drain voltage is reduced from 4.5V to 3.3V in order to achieve the same write speed as the conventional one.

Due to the reduction of the drain voltage, increase of the drain current caused by punch-through can be suppressed, resultantly, scaling of gate length becomes easy. For example, conventionally, a drain voltage of about 5V is needed in order to increase the write speed by a certain amount. At this time, as shown in FIG. 4, the leakage current is too large for a gate length of 0.18 μto be realized. In contrast, in the present embodiment, however, since the drain voltage can be set to be 3.3V, as obtained from the graph for a gate length of 0.18 μin FIG. 4, the leakage current is reduced to a value order of 500 pA/μm and that in a region for practical use.

Namely, in the present embodiment, by using a bottom insulating film comprised of an FN tunneling nitride film, the drain voltage can be reduced with a high write speed maintained at 1 μs. Therefore, there is an advantage that the punch-through is hard to occur and the reduction of the gate length becomes easy.

Here, it is not mentioned in detail here that in order to further perform scaling of gate length, it is needed to not only reduce the leakage current, but also increase the concentration of the channel impurity to suppress the short-channel effects.

In the present embodiment, the write drain voltage is lowered to the power supply voltage Vcc (3.3V) from the conventional value of 5V, so a lowered write voltage becomes possible. Therefore, in write operations, it is not necessary to increase the voltage on the bit lines using a charge-pump circuit, and the time to pre-charge the bit lines is short, accordingly, the operation cycle for writing one page can be shortened.

In the present embodiment, even though the bottom insulating film 11 in made to be a single layer of an FN tunneling insulating film, in the present invention, same effects as mentioned above can also be achieved by using a bottom insulating film comprised of a number of films and including in this stacked film an FN tunneling insulating film (dielectric film) lowering the energy barrier with silicon.

Figure 5:
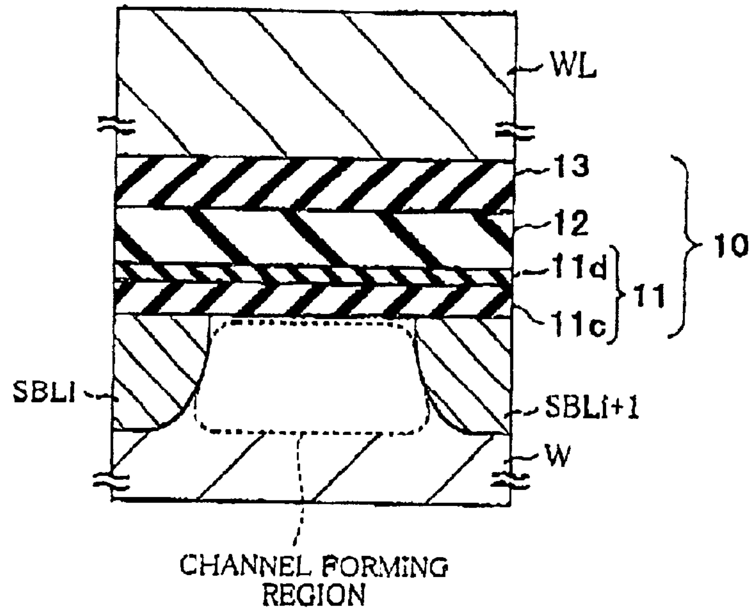
FIG. 5 is a cross-sectional view of the first modification of the gate insulating film configuration of a memory transistor according to the first, second, third and fourth embodiments of the present invention.
Figure 6:
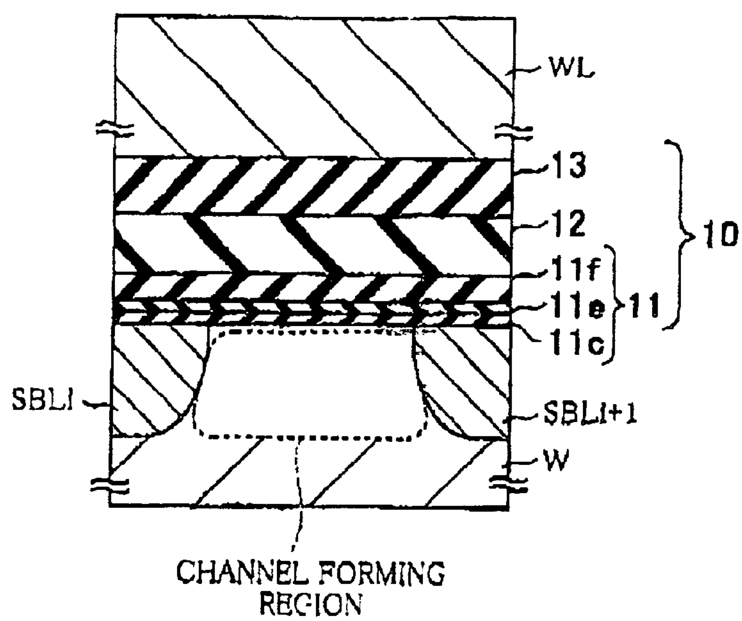
FIG. 6 is a cross-sectional view of the second modification of the gate insulating film configuration of a memory transistor according to the first, second, third and fourth embodiments of the present invention.

FIG. 5 and FIG. 6 show modifications of the configuration of a memory transistor related to the present embodiment.

In the memory transistor shown in FIG. 5, the bottom insulating film 11 is comprised of a first film 11*c* that has a relatively low energy barrier with silicon on the channel forming region, and a second film 11*d* on the first film 11*c*, which has a relatively high energy barrier with silicon, but is efficient to reduce the number of carrier traps in the first film 11*c*.

In detail, for example, an $NH_3$ RTN-SiON film may be used as the first film 11*c*. To form this film, the surface silicon in thermally oxidized to form a thermally oxidized silicon film, then a RTN process in performed to this thermally oxidized silicon film in an ammonia atmosphere. In this $NH_3$ RTN process, dangling bonds in the thermally oxidized film are replaced by nitrogen, and the number of carrier traps is reduced more or less.

In addition, as the second film 11*d*, use may be made of the $N_2O$ re-oxidized $SiO_2$ film that is formed after the surface of an $NH_3$ RTN-SiON film is re-oxidized in an $N_2O$ atmosphere. In this re-oxidization process, hydrogen in the $NH_3$ RTN-SiON film dissipates, as a result, the number of the carrier traps in the film is further reduced.

In the memory transistor shown in FIG. 6, the bottom insulating film 11 is comprised of a first film 11*c* that has a relatively low energy barrier with silicon on the channel forming region, and a second film 11*e* and a third film 11*f* on the first film 11*c* which have relatively high energy barriers with silicon, but a smaller number of carrier traps. The third film 11*f* has quite a smaller number of carrier traps, and the second film 11*e* is a thin intermediate film for the formation of the third film 11*f*.

In detail, an $NH_3$ RTN-SiON film may be used as the first film 11*c*.

In addition, as the second film 11*e*, use may be made of the nitride silicon film (DCS-SiN) that is formed by LP-CVD using dichlorosilane (DCS). As the third film 11*f*, use may be made of the silicon nitride film (TCS-SiN) formed by LP-CVD using tetrachlorosilane (TCS).

Figure 7:
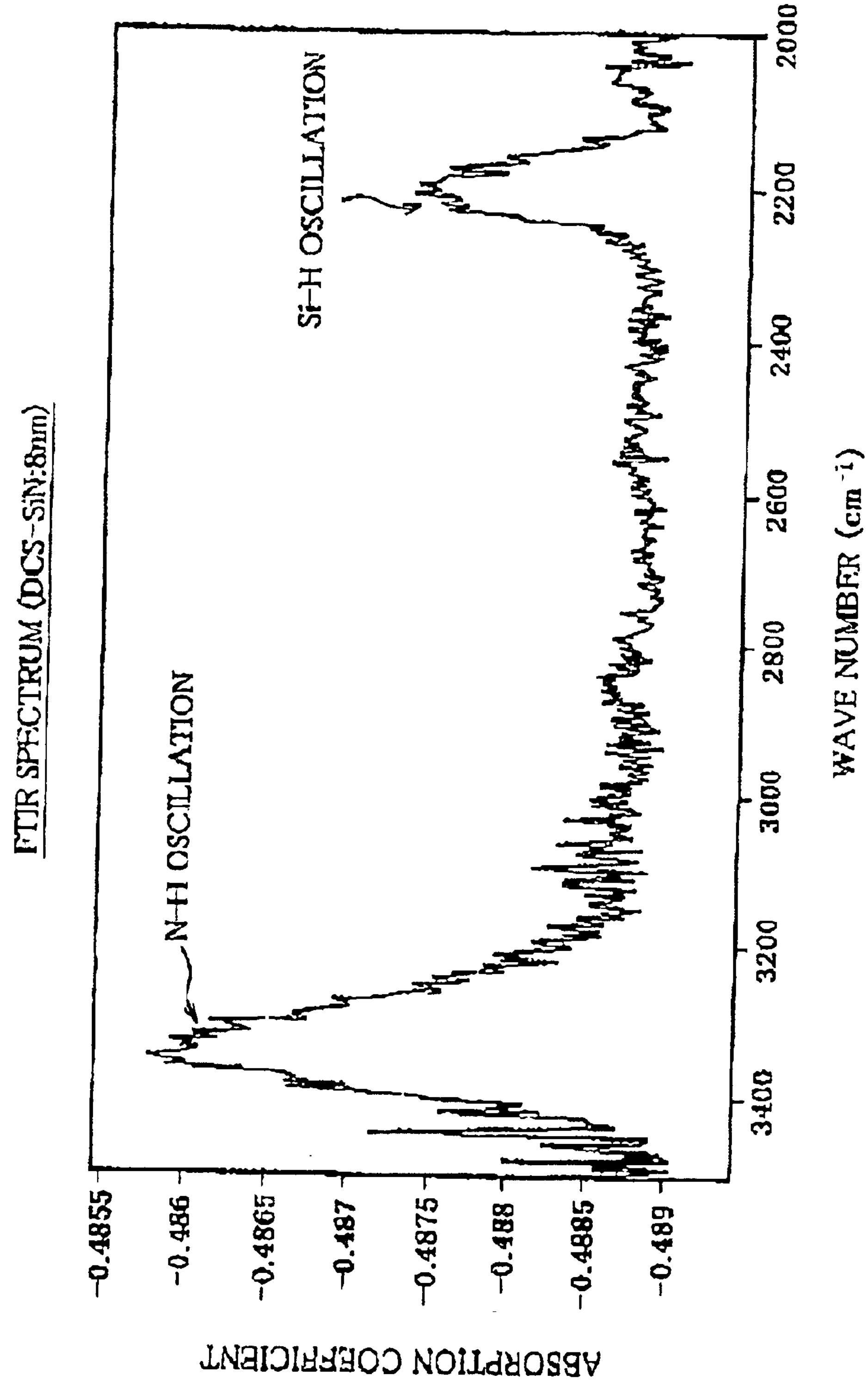
FIG. 7 is a graph showing the FTIR spectrum of DCS-SiN concerning with a modification of the gate insulating film configuration of a memory transistor according to the first, second, third, and fourth embodiments of the present invention.
Figure 8:
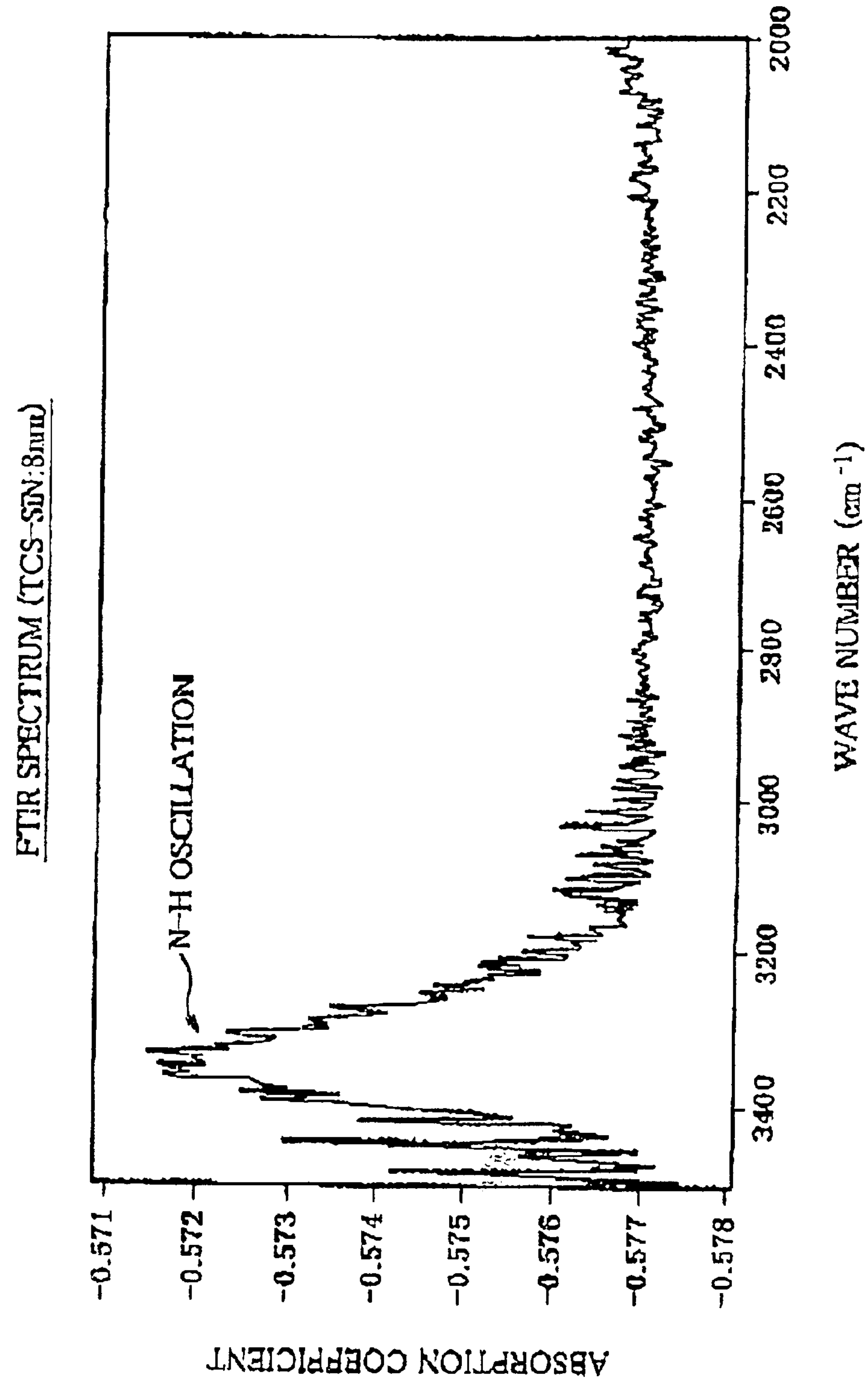
FIG. 8 is a graph showing the FTIR spectrum of TCS-SiN concerning with a modification of the gate insulating film configuration of a memory transistor according to the first, second, third, and fourth embodiments of the present invention.

FIG. 7 and FIG. 8 a show the FTIR spectra of DCS-SiN and TCS-SiN.

The Si—H oscillation (wave coefficient is about 2200 $cm^{-1}$), and the N—H oscillation (wave coefficient is about 3300 $cm^{-1}$) are observed in DCS-SiN. On the other hand, it is found that in TCS-SiN, the N—H oscillation is observed, but the Si—H oscillation is almost not.

Figures 9, 10:
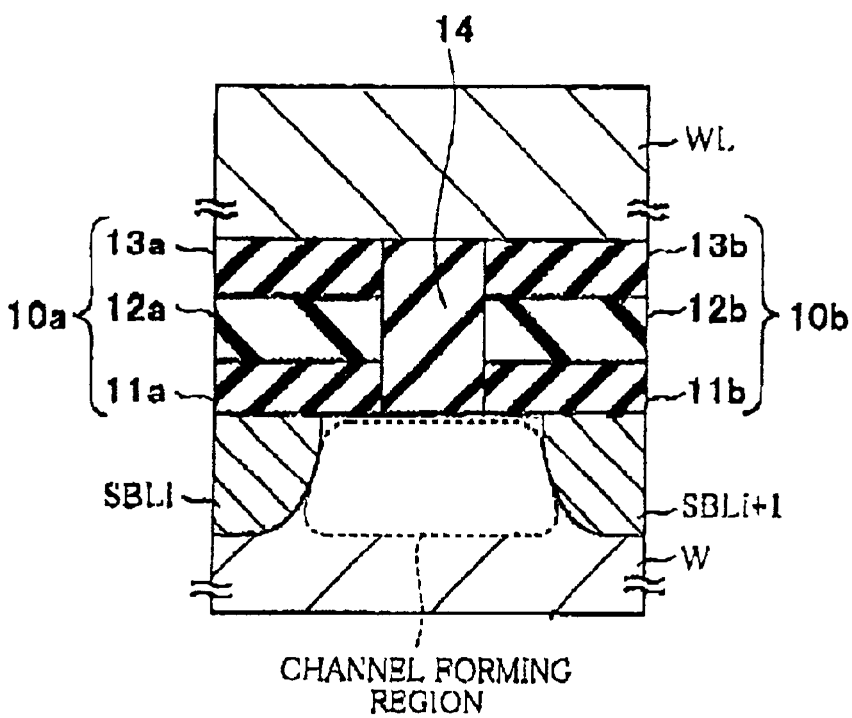
FIG. 9 shows the comparison of the bond densities of DCS-SiN and TCS-SiN concerning with a modification of the gate insulating film configuration of a memory transistor according to the first, second, third, and fourth embodiments of the present invention.
FIG. 10 is a cross-sectional view of a memory transistor according to the second embodiment of the present invention.

FIG. 9 shows the calculated bond densities.

Compare TCS-SiN and DCS-SiN, it is found that although the N—H bond densities are not so different, the Si—H bond density in TCS is lower by about one order of magnitude. Generally, charge traps in the SiN film are formed by the Si dangling bonds, and are positively correlated with the Si—H bond density. Therefore, it is found it is possible to use the TCS-SiN film as a nitride film of low traps.

An a modification of those above, the bottom insulating film 11 may be an insulating film that has a low energy barrier with silicon, a smaller number of carrier traps, and is suitable to injection of hot carriers.

As the above bottom insulating film 11, in addition to a silicon nitride film, silicon oxynitride film, and the above modification, use may also be made of anyone or a combination of a tantalum oxide film, zirconium oxide film, aluminum oxide film, titanium oxide film, hafnium oxide, barium strontium titanium oxide, and an yttrium oxide film.

Second Embodiment

The second embodiment relates to a modification of the configuration of the gate insulating film of a memory transistor in a virtual grounding NOR type nonvolatile semiconductor memory device. Tho circuit diagram in FIG. 1 and the plain view in FIG. 2 are also applicable to the second embodiment.

FIG. 10 is a cross-sectional view for illustrating the configuration of a memory transistor related to the second embodiment.

In this memory transistor, the gate insulating film consists of a gate insulating film 10*a* at the side of the sub-bit line SBLi and a gate insulating film 10*b* at the side of the sub-bit line SBLi+1. The two gate insulating films 10*a* and 10*b* are spatially separated by a single layer gate insulating film 14 above the central portion of the channel.

The gate insulating films 10*a* and 10*b* have the same structure as gate insulating film 10 in the first embodiment. That is, the gate insulating film 10*a* consists of a bottom insulating film 11*a* (FN tunneling nitride film), a nitride film 12*a*, and a top insulating film 13*a* in order from the bottom. Similarly, the gate insulating film 10*b* consists of a bottom insulating film 11*b* (FN tunneling nitride film), a nitride film 12*b*, and a top insulating film 13*b* in order from the bottom. The bottom insulating films 11*a*, 11*b*, nitride films 12*a*, 12*b*, and top insulating films 13*a*, 13*b* are comprised of the same materials, of the same thicknesses, and by using the same methods as the bottom insulating film 11, nitride film 12, and top insulating film 13 in the first embodiment, respectively, The insulating film 14 between the gate insulating films 10*a* and 10*b* is comprised of a silicon dioxide film formed by, for example, CVD and buries the space between the gate insulating films at the two sides.

To form such a gate insulating film structure, first, in the same way as in the first embodiment, after the stacked film of a bottom insulating film (FN tunneling nitride film), a nitride film, and a top insulating film is formed on the entire area, part of the stacked film on the central portion of the channel forming region in removed by etching, so gate insulating film 10*a* and 10*b* are formed spatially separated.

Then, silicon oxide film is thickly deposited on the entire area and etchback is performed from the top of the silicon oxide film. The etchback is stopped when the insulating film on the gate insulating films 10a and 10b is removed and the gate insulating film 14 buries just the space between gate insulating films 10a and 10b, whereupon the desired gate insulating film structure is completed. In order to prevent over etching, an etching stopper film, for example, a thin silicon nitride film, may be formed beforehand on the gate insulating films 10a and 10b.

Next, in the same way as in the first embodiment, after the process of forming word lines WL etc., the memory transistor is completed.

Write, read and erasure operations of this memory transistor can be performed in the same manner as the first embodiment.

That is, apply a voltage of 3.3V to the bit line that is one of the connections to which the selected memory transistor that is to be written is connected, and 0V to the other bit line, and 5V to the selected word line, and 0V to all other bit lines and nonselected word lines. Therefore, a voltage of 3.3V in applied between the source and drain of the selected memory transistor, and electrons are accelerated by electric fields in so formed channel. They become hot electrons near the end of the channel in the horizontal direction, and part of them surmount the energy barrier with the bottom insulating film 11a or 11b, and are injected into the carrier traps in inside the gate insulating film 10a or 10b.

Now, assume write operations to the gate insulating film 10a are performed by such a means. In an operation of writing data to the opposite side, reverse the application direction of the source-drain voltage with respect to the above write operation, the rest voltage conditions are the same. Therefore, by the same mechanisms, a write operation to the gate insulating film 10b in realized.

In a read operation, with the source to be the side where the charge to be read in a memory transistor is held, and drain to be the other side, apply a specified read drain voltage to sub-bit line SSLi and SSLi+1. In addition, apply a specified read gate voltage to the word line WL. So, a potential change related to the threshold voltage of the memory transistor appears on the bit line at the drain side, and is detected by a sense amplifier.

When reading charge from the opposite side, by reversing the application direction of the voltage between the source and drain, a similar read operation is possible.

The same as the first embodiment, erasure is performed by extracting charge from the entire channel, or, the side of the sub-bit line SBL utilizing the FN tunneling or direct tunneling. In addition, erasure may also be performed by injecting hot holes caused by band-to-band tunneling current.

In the second embodiment, same effects as in the previous first embodiment can also be achieved because the bottom insulating film 10a and 10b each is comprised of an FN tunneling insulating film.

That is, in a write operation (or an erasure operations), the energy barrier with the bottom insulting film 11a and 11b that hot electrons (or hot holes) should surmount is reduced comparing with the conventional configuration including a bottom insulating film comprised of an oxide film, thus the efficiency of hot electron injection is improved, and the write drain voltage is reduced from 4.5V to 3.3V in order to achieve the same write speed an the conventional one.

Due to the reduction of the drain voltage, increase of the drain current caused by a punch-through can be suppressed, resultantly, scaling of gate length becomes easy.

Moreover, because lowered write voltages become possible, in write operations, it is not necessary to increase the voltage on the bit lines using a charge-pump circuit, and the time to pre-charge the bit lines is short, accordingly, the operation cycle for writing one page can be shortened. Since two bits can be written into one memory cell, the effective memory cell area per bit is small.

Note that in the second embodiment, the modification in the first embodiment (FIG. 5 and FIG. 6) is also applicable to the structure of the gate insulating films 10a and 10b.

Third Embodiment

The third embodiment relates to an application of the technique of FN tunneling low barrier to a transistor of a configuration comprising a second gate electrode, so-called control gate, at the source and/or drain side.

Figure 11:
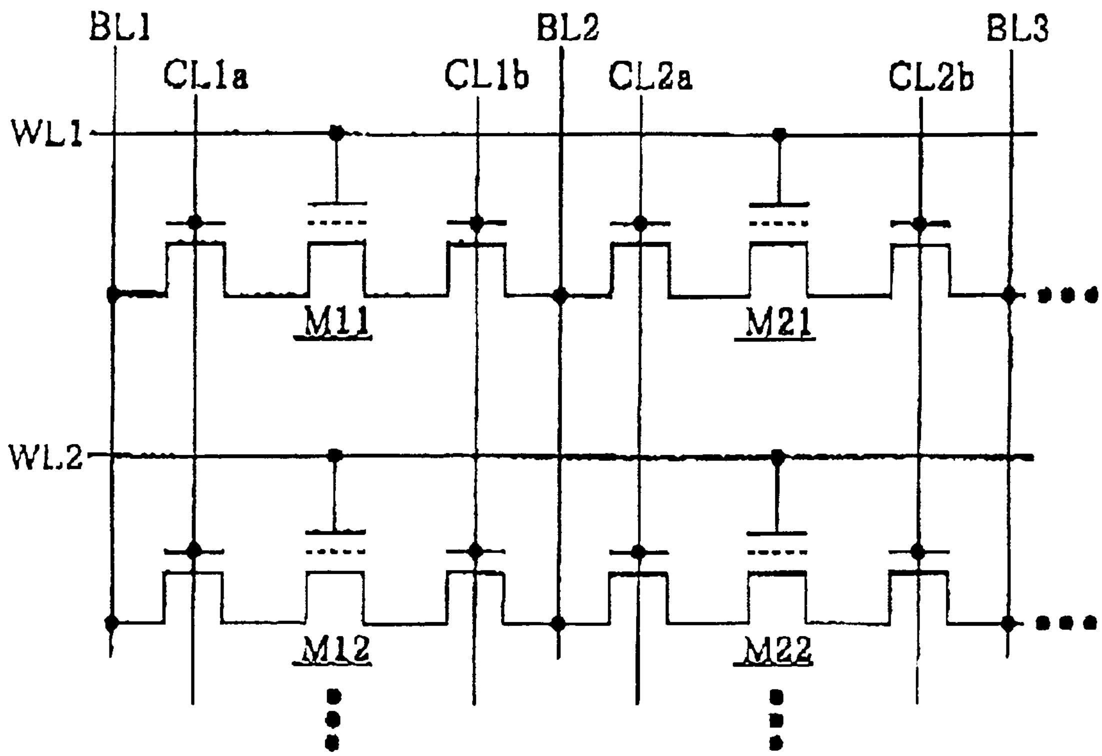
FIG. 11 is an equivalent circuit diagram of the first example of the configuration of a virtual grounding NOR type memory cell array according to the third embodiment of the present invention.
Figure 12:
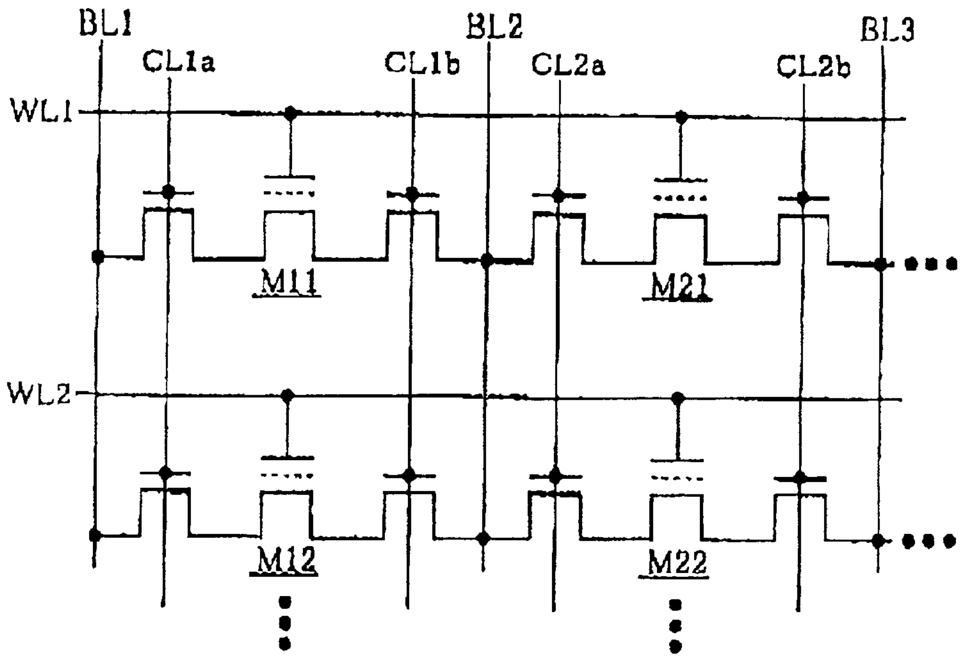
FIG. 12 is an equivalent circuit diagram of the second example of the configuration of a virtual grounding NOR type memory cell array according to the third embodiment of the present invention.

FIG. 11 and FIG. 12 are circuit diagrams of examples of configurations of memory cell arrays according to the third embodiment.

These memory transistor arrays are basically virtual grounding NOR type memory cell arrays the same as that in the fifth embodiment. But, in the present memory cell arrays, however, in each memory transistor, the control gates are provided to extend from the source and drain impurity region side to partly overlap with the channel forming region.

Further, the arrays are provided with a control line CL1a commonly connecting the control gates at one side of the memory transistors M11, M12, . . . connected in the bit line direction, a control line CL1b commonly connecting the control gates at the other side, a control line CL2a commonly connecting the control gates at one side of the memory transistors M21, M22, . . . connected in the bit line direction and belonging to another row, a control line CL2b commonly connecting the control gates at the other side. The control lines and the word lines are controlled separately.

In FIG. 11, by partly overlapping the control lines with the channel forming region, two MOS control transistors are formed at the two sides of the center memory transistor. While, in FIG. 12, the central portion is the MOS select transistor, and formed at its sides are memory transistors whose gates are connected to the control lines.

Figure 13:
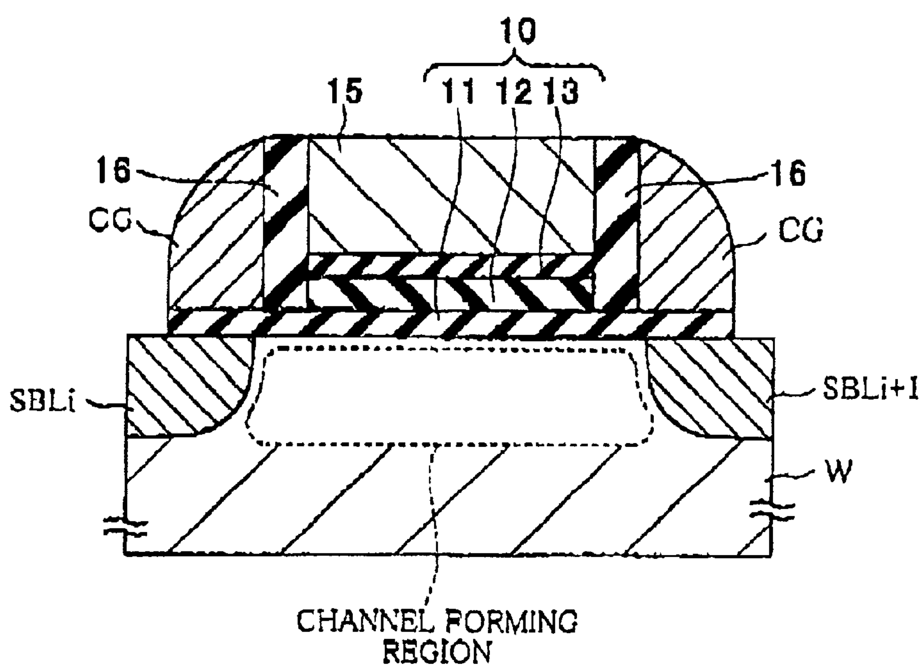
FIG. 13 is a cross-sectional view of the first example of the structure of a memory transistor according to the third embodiment of the present invention.
Figure 14:
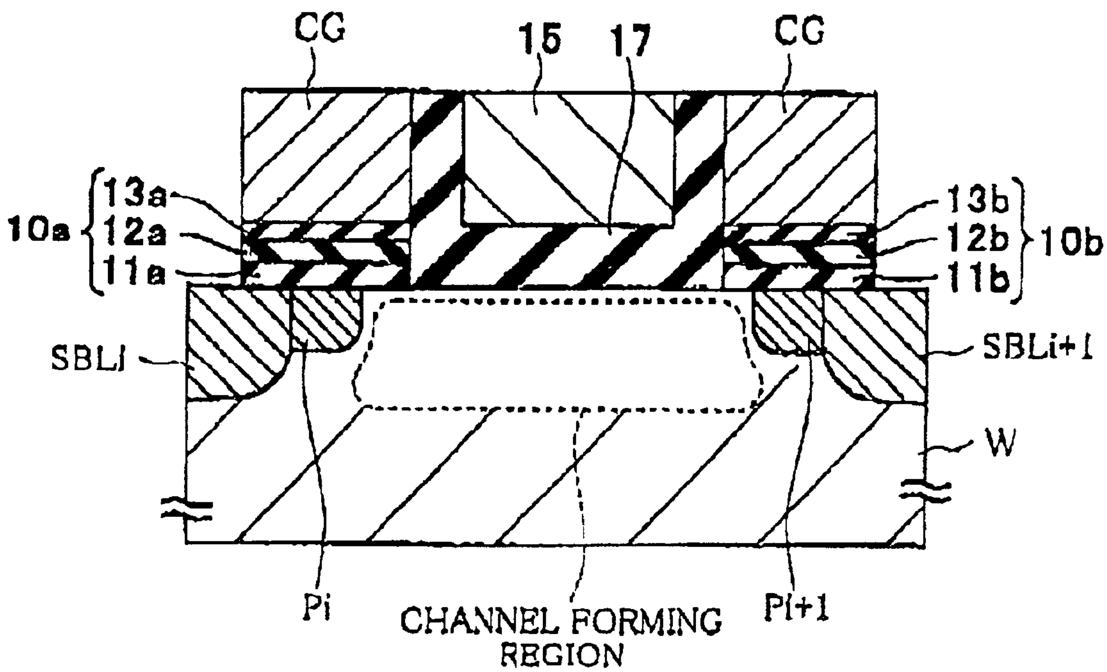
FIG. 14 is a cross-sectional view of the second example of the structure of a memory transistor according to the third embodiment of the present invention.

FIG. 13 and FIG. 14 illustrate the transistor configurations according to the third embodiment.

In the memory transistor shown in FIG. 13, above the center portion of the channel forming region, a gate electrode 15 of the memory transistor is stacked on the gate insulating film 10 consisting of a bottom insulating film 11, a nitride film 12, and a top insulating film 13 in order from the bottom. This gate electrode 15 is connected with the upper interconnection layer forming the not shown word line and is connected in common between the cells in the word line direction.

The bottom insulating film 11 at bottom of the gate insulating film 10 are extended on the sub-bit lines SBLi and SBLi+1 at the two sides in the channel direction. On the extending portion of the bottom insulating films, control gates CG are formed. The control gates CG and the gate electrode 15 are separated by a spacer insulating film 16 between them.

To form such a memory transistor, for example, a gate insulating film 10 and the conductive film for forming gate electrode are formed on the entire area, then, when patterning the gate electrode, from top of the gate insulating film 10, the first two layers, namely, top insulating film 13 and nitride film 12 are processed simultaneously. Next, this pattern is covered by the dielectric film that serves as the spacer insulating film 16, and is anisotropically etched. Due to this, the spacer insulating films 16 are formed on the sidewalls of the gate electrode. A conductive film for forming the control gate CG is deposited, then the conductive film is anisotropically etched to leave it as sidewalls and thereby form the control gates CG.

A transistor formed in this way is a memory transistor involving an operation of so-called source-side injection. In operation, the control gates CG at two sides of the channel forming region function as gate electrodes of select transistors. Since this operation has been well known, detailed explanations are omitted here.

However, in the present embodiment, because the bottom insulating film 10 is comprised of, or is a multi-layer structure including, a dielectric film such as FN tunneling nitride film that lowers the energy barrier with silicon, efficiency of hot electron injection is improved, and the same effects as in the first embodiment can be achieved.

On the other hand, in the memory transistor shown in FIG. 14, the structure of the gate electrode is the same as that in FIG. 13. That is, there are a gate electrode 15 formed above the center portion of the channel forming region and connected to a word line WL, and control gates CG provided at the two sides in the channel direction and insulated and separated from the gate electrode 15.

However, different from that in FIG. 13, in this memory transistor the gate insulating film 10 is formed between the control gates CG and the sub-bit lines SBLi, SBLi+1, or the edge of the channel forming region. The gate electrode 15 on the insulating film 17 is buried between the two control gates CG spatially separated at the source side and drain side and the stacked pattern of the gate insulating film 10.

To form such a memory transistor, for example, a gate insulating film 10 and the conductive film for forming control gates CG are formed on the entire area, then, when patterning the two control gates, the gate insulating film 10 is processed at one time. Therefore the stacked patterns of the two control gates CG and the gate insulating film 10 are formed spatially separated at the side of the sub-bit line SBLi and the side of sub-bit line SBLi+1. Then an insulating film 17 and the conductive film for forming the gate electrode 15 are deposited on the entire area, and are then etched back. In this way, the gate electrode 15 and the insulating film 17 are formed burying the space between the stacked patterns of the two control gates CG and the gate insulating film 10.

In a transistor formed in this way in the central portion of the channel forming region, a select MOS transistor connected to a word line is formed. In addition, p-type impurity regions at high concentrations are formed at the facing ends of the sub-bit line SBLi and SBLi+1 (pocket region). Above the pocket regions formed by large-angle-tilt ion-implantation and the diffused layer, the control gates CG are arranged on the ONO type gate insulating films 10*a* and 10*b* including the charge storing means. The combination of this select gate 15 and the control gates CG is basically the same as a source-side injection type memory cell having split gate structure.

In the memory transistor in the present embodiment, as the bottom insulating film 11 at the bottom of the gate insulating film, use may be made of dielectric films exhibiting FN tunneling characteristics as shown in the first embodiment, such as a silicon nitride film, a silicon oxynitride film, a multi-layer film as shown in FIG. 5 and FIG. 6, and anyone of a tantalum oxide film and other dielectric films. Therefore, the energy barrier at the side of the conduction band is lower than 3.2 eV of the oxide film, the efficiency of hot electron injection is improved.

As the nitride film 12 on the bottom film 11, as in the first embodiment, the nitride film fabricated by LP-CVD using a mixed gas of DCS and ammonia may be used.

The select gate MOS transistor is used in order for the source-side injection to be performed with a high efficiency in a write operation. In addition, in an erasure operation, when the charge storing means is over erased, this transistor plays a role to keep constant the threshold voltage Vth of an erasure state of a memory transistor. So, the threshold voltage of this select gate MOS transistor is set to be in the range of 0.5V to 1V.

Write, read and erasure operations of this memory transistor can be performed in the same manner as the first embodiment.

That is, apply a voltage of 3.3V to the bit line that is one of the connections to which the selected memory transistor that is to be written is connected, and 0V to the other one bit line, and 5V to the selected word line, and 0V to all other bit lines and nonselected word lines. In addition, the gate of the select MOS transistor is biased beforehand by about 3V, Therefore, a voltage of 3.3V is applied between the source and drain of the selected memory transistor, and the select gate above the central portion of the channel forming region is turned on. So electrons are supplied in the channel from the sub-bit line serving as a source, and are accelerated by electric fields in the channel. These accelerated electrons become hot electrons near the end of the channel in the horizontal direction, and part of them surmount the energy barrier with the bottom insulating film 11*a* or 11*b*, and are injected into the carrier traps inside the gate insulating film 10*a* or 10*b*. In this case, the control gates CG optimize the electric field under the charge storing means, resulting in the optimization of the balance between the generation efficiency and the injection efficiency into the charge storing means of the source side hot electrons. As a result, hot electrons are injected into the charge storing means from the source-side with a high efficiency. Comparing with the hot electron injection in the first embodiment, by this operation of source-side injection, the injection efficiency of hot electrons is improved by two to three orders of magnitude.

Now, assume write operations to the gate insulating film 10*a* are performed by such a means. When writing data to the opposite side, reverse the application direction of the source-drain voltage with respect to the above write operation, the rest voltage conditions are the same. Therefore, by the same mechanisms, a write operation to the gate insulating film 10*b* in realized.

In this write operation, the time of writing to one side of the memory cell is not greater than 1 $\mu$s, a very high speed, and the write current needed by write operations can be reduced as small as not greater than 10 $\mu$A.

In this memory array, when a page write is performed, since it is difficult to simultaneously write all memory cells connected to the same word line, for example, a page write may be achieved by dividing the memory cells in one row into a number of groups by controlling the control gates CG, and performing write operations for a number of times.

In a read operation, with the source to be the side where the charge to be read in a memory transistor is held, and drain to be the other side, apply a specified read drain voltage to sub-bit line SSLi and SSLi+1. In addition, apply a specified read gate voltage to the word line WL. So, a potential change related to the threshold voltage of the memory transistor appears on the bit line at the drain side, and is detected by a sense amplifier.

When reading charge from the opposite side, by reversing the application direction of the voltage between source and drain, a similar read operation is possible.

As in the first embodiment, erasure is performed by extracting charge from the entire channel, or, the side of the sub-bit line SBL utilizing FN tunneling or direct tunneling. In addition, erasure may also be performed by injecting hot holes caused by band-to-band tunneling current.

In the third embodiment, same effects as in the first embodiment can also be achieved because the bottom insulating film 10*a* and 10*b* each in comprised of an FN tunneling insulating film.

That is, in write operations (or erasure operations), the energy barrier with the bottom insulting film 11*a* or 11*b* that hot electrons (or hot holes) should surmount is reduced comparing with the conventional configuration including a bottom film comprised of an oxide, film, thus efficiency of hot electron injection is improved, and the write drain voltage is reduced from 4.5V to 3.3V in order to achieve the same write speed as the conventional one.

Due to the reduction of drain voltage, increase of the drain current caused by punch-through can be suppressed, resultantly, scaling of gate length becomes easy.

Moreover, because lowered write voltages become possible, in write operations, it is not necessary to increase the voltage on the bit lines using a charge-pump circuit, and the time to pre-charge the bit lines is short, accordingly, the operation cycle for writing one page can be shortened. Since two bits can be written into one memory cell, the effective memory cell area per bit is small.

In addition, it is possible to suppress the damage of hot carrier injection to the bottom insulating film.

Introduced in the following embodiments are other memory cells and memory transistor configurations to which the present invention in applicable.

Fourth Embodiment

Figure 15:
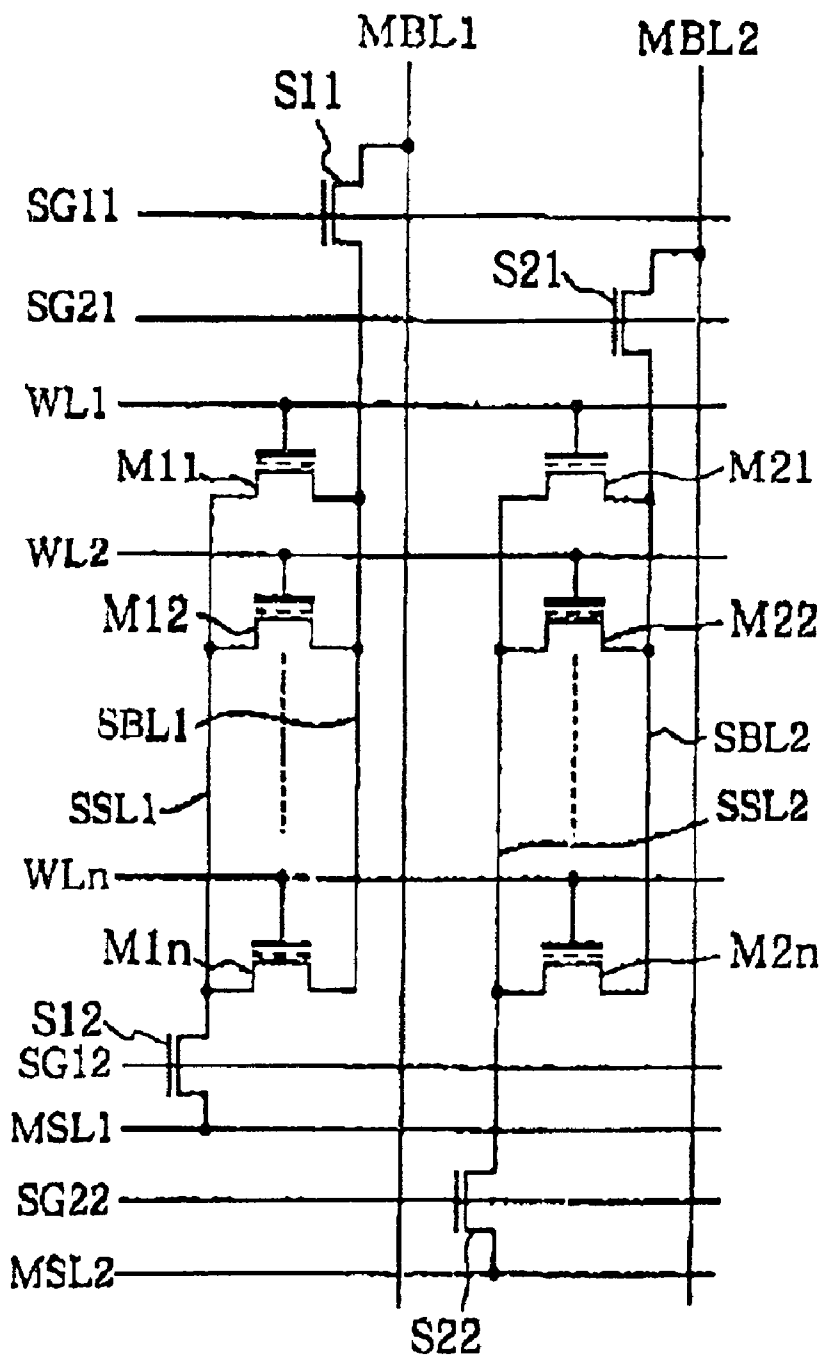
FIG. 15 is a circuit diagram of the configuration of a NOR type memory cell array according to the fourth embodiment of the present invention.
Figure 16:
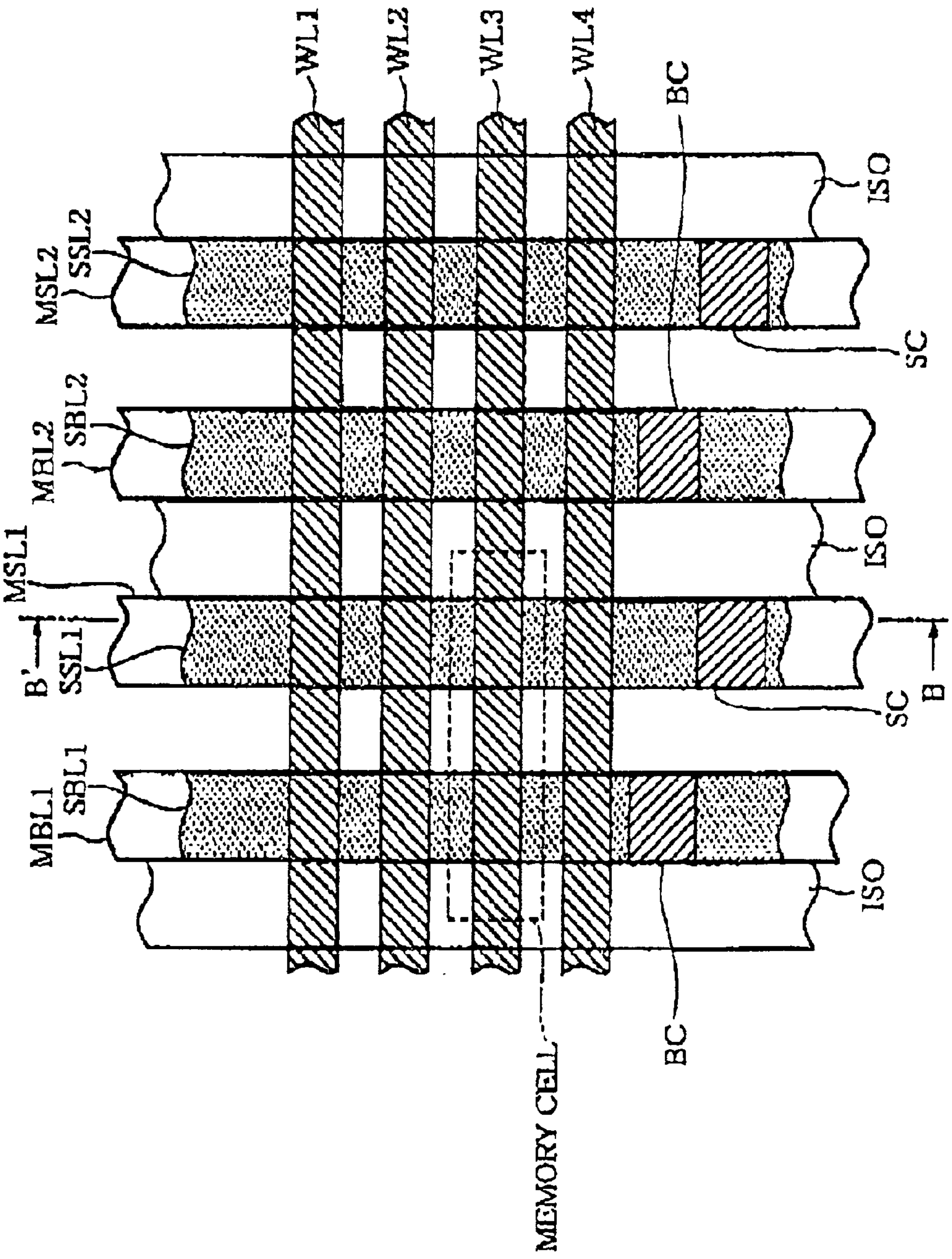
FIG. 16 is a plan view of a NOR type memory cell array according to the fourth embodiment of the present invention.
Figure 17:
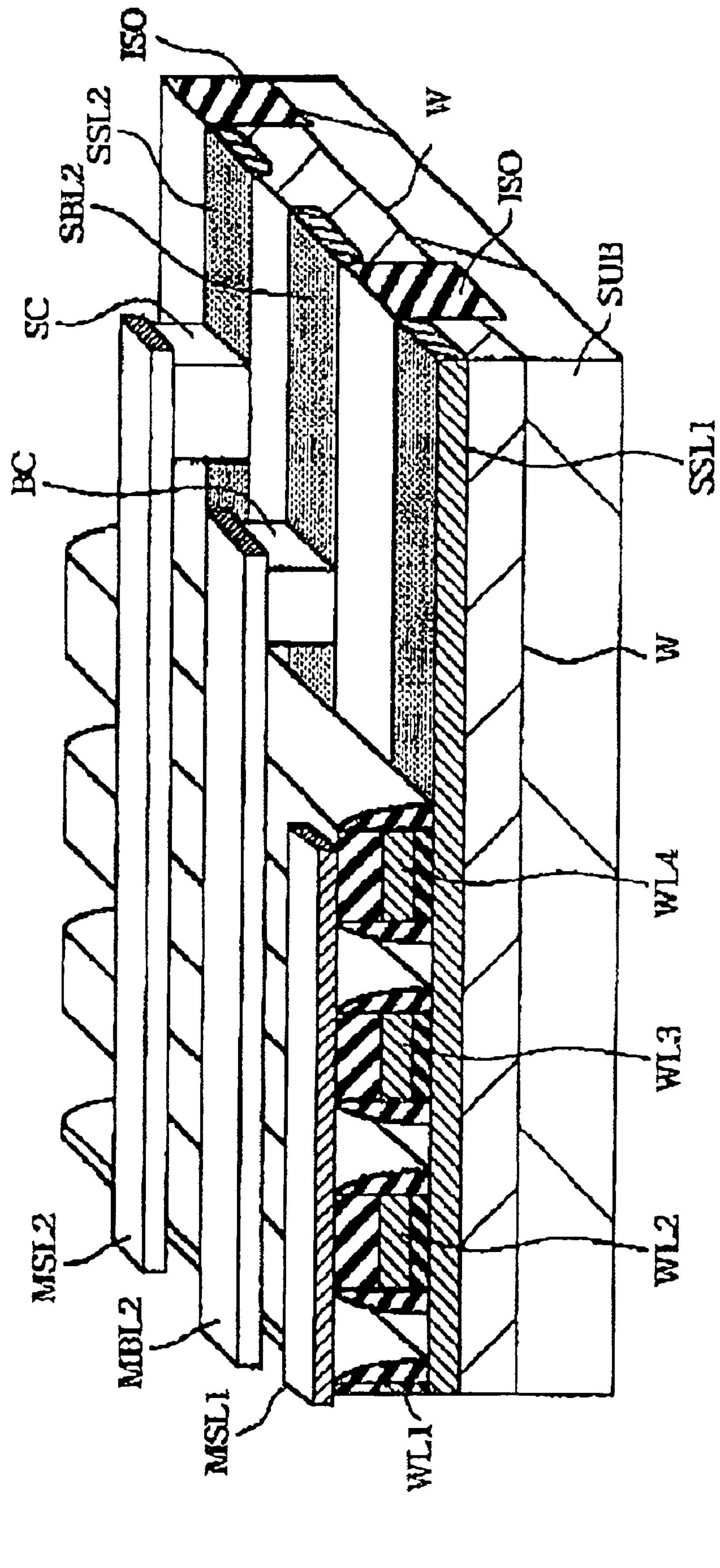
FIG. 17 is a cross-sectional bird's-eye view of the NOR type memory cell array according to the first embodiment of the present invention along the line B–B' shown in FIG. 16.

FIG. 15 is a circuit diagram of the memory cell array of a nonvolatile semiconductor memory device according to the fourth embodiment, FIG. 16 is the plan view of this memory sell array, and FIG. 17 in a cross-sectional bird's-eye view along the line B–B' in FIG. 16.

In the present nonvolatile semiconductor memory device, bit lines (first common lines) are hierarchized into main bit lines and sub-bit lines, while source lines (second common lines) are hierarchized into main source lines and sub-source lines.

A sub-bit line SBL1 is connected to a main bit line MBL1 through a select transistor S11, and a sub-bit line SBL2 to a main bit line MBL2 through a select transistor S21. Further, a sub-source line SSL1 is connected to a main source line MSL1 through a select transistor S12, and a nub-source line SSL2 to a main source line MSL2 through a select transistor S22.

Memory transistors $M_{11}$ to $M_{1n}$ (for example, n=128) are connected in parallel to the sub-bit line SBL1 and the sub-source line SSL1, and memory transistors $M_{21}$ to $M_{2n}$ are connected in parallel to the sub-bit line SBL2 and the sub-source line SSL2. The n number of memory transistors connected in parallel to each other and the two select transistors (S11 and S12, or S21 and S22) compose a unit block of the memory cell array.

The gate electrodes of the memory transistors $M_{11}$, $M_{21}$ . . . adjacent in the word line direction are connected to the word line WL1. Similarly the gate electrodes of the memory transistors $M_{12}$, $M_{22}$ . . . are connected to the word line WL2. Further, the gate electrodes of the memory transistors $M_{1n}$, $M_{2n}$ . . . are connected to the word line WLn.

The select transistors $S_{11}$, . . . adjacent in the word line direction are controlled by a select line SG11. while select transistors $S_{21}$, . . . are controlled by a select line SG21. Similarly, select transistors $S_{12}$, . . . adjacent in the word line direction are controlled by a select line SG12, while select transistors $S_{22}$, . . . are controlled by a select line SG22.

In this miniature NOR type cell array, as shown in FIG. 17, n-wells W are formed in the vicinity of the surface of the semiconductor substrate SUB. The n-wells W are separated in the word line direction by element isolation layers ISO which are formed by burying an insulator into trenches and are arranged in parallel stripes.

An n-well region separated by the element isolation layers ISO becomes the active region of a memory transistor. A p-type impurity is doped at a high concentration into parallel stripes at a distance from each other at the two sides of the active region in the width direction, thereby forming sub-bit lines SBL1, SBL2 (hereinafter indicated by SBL) and sub-source lines SSL1, SSL2 (hereinafter indicated by SSL).

Above and perpendicular to the sub-bit lines SBL and the sub-source lines SSL via insulating films, word lines WL1, WL2, WL3, WL4, . . . (hereinafter indicated by WL) are arranged at regular intervals. These word lines WL are above the n-well W and the element isolation layers ISO via the insulating films containing the charge storing means inside.

The intersecting portion of a portion of an n-well W between a sub-bit line SBL and a sub-source line SSL with a word line WL forms the channel forming region of a memory transistor. The region of the sub-bit line and the region of the sub-source line adjacent to the channel forming region function as the drain and source, respectively.

The word lines WL are covered by offset insulating layers on their upper surfaces and sidewall insulating layers on their sidewalls (in the present case, a normal interlayer insulating film is also possible).

In these insulating layers, bit contacts BC contacting the sub-bit lines SBL and source contacts SC contacting the sub-source lines SSL are formed at certain intervals. For example, one bit contact BC and one source contact SC are set for every 128 memory transistors in the bit line direction.

Above the insulating layers, main bit linen MBL1, NBL2, . . . in contact with the bit contacts BC and main source lines MSL1, MSL2, . . . , in contact with the source contacts SC are formed alternately in parallel stripes.

In this miniature NOR type cell array, the first common lines (bit lines) and the second common lines (source lines) are hierarchical in structure, hence it is not necessary to set a bit contact BC and a source contact SC for each memory cell. Accordingly, in principle, there is no variation in the contact resistance itself. A bit contact BC and a source contact SC are formed for example for every 128 memory cells, If plugs are not formed by self alignment, the offset insulating layers and the sidewall insulating layers are not needed. That is, an ordinary interlayer insulating film is deposited thickly to bury the memory transistors, then contacts are opened by the conventional photolithography and etching.

Since a quasi contactless structure is formed wherein the sub-lines (sub-bit lines and sub-source lines) are formed by the impurity regions, there is almost no wasted space, so when forming layers by the minimum line width F of the limit of the wafer process, very small cells of areas close to $8F^2$ can be fabricated.

Moreover, because the bit lines and source lines are hierarchized and select transistors S11 or S21 separate the parallel memory transistor groups in nonselected unit blocks from the main bit lines MBL1 or MBL2, the capacitances of the main bit lines are appreciably reduced and the speed increased and power consumption decreased. In addition, due to the functions of the select transistors S12 and S22, the sub-source lines are separated from the main source lines enabling a reduction in capacitances.

To further increase speed, the sub-bit lines SBL and sub-source lines SSL may be formed by impurity regions clad with a silicide and the main bit lines MBL and main source lines MSL may be made metal interconnections.

In the fourth embodiment, as described later, write operations are performed by injection of hot electrons caused by band-to-band tunneling current. Therefore, each memory cell is comprised of p-type MONOS memory transistors.

Structure of the memory transistor itself is the same as that in FIG. 3 (or FIG. 5 and FIG. 6), related to the first embodiment. But the conductive type of the impurity introduced into wells W and the sub-bit lines SBLi and SBLi+1 in opposite to the first embodiment. In addition, due to the structure of the memory cell array, a source impurity region and a drain impurity region (sub-bit line SBLi and SBLi+1) are formed at the two sides of the word line WL in the transverse direction.

In the present embodiment, as in the first embodiment, as the bottom insulating film 11, use may be made of the dielectric films exhibiting FN tunneling characteristics, such an a silicon nitride film, a silicon oxynitride film, a multilayer film an shown in FIG. 5 and FIG. 6, and anyone of a tantalum oxide film and other dielectric films.

In addition, in the formation of the memory cell array, by the same method as in the first embodiment, p-type impurity regions serving as the sub-bit lines are formed in wells W, after the formation of the gate insulating film 10, a conductive film forming the gate electrodes (word lines WL) and the offset insulating layer (not shown) are stacked, then this stacked layer is processed to the same pattern at one time.

Next, to form a memory cell array of such a configuration as shown in FIG. 17, the self alignment contacts are formed along with the sidewall insulating films. Bit contacts BC and source contacts SC are formed on the sub-bit lines SBL and the sub-source lines SSL exposed through the self alignment contacts.

Then, the regions surrounding these plugs are buried with the interlayer insulating film. The main bit lines and the main source lines are formed on the interlayer insulating film, then the upper layer interconnections are formed over the interlayer insulating film, the overcoat film is formed, and pads are opened, thereby completing the nonvolatile memory cell array.

Next, an example of setting the bias and the operation of a nonvolatile memory of such a configuration will be explained using as an example the operation of writing data to a memory transistor M11.

In a write operation, when necessary, after setting a write inhibit voltage, apply a program voltage.

For example, apply a specified voltage of 4V to the selected word line WL1, and 0V to the substrate. With the selected main source line MSL1 set open, apply a voltage of −4V to the selected main bit line MBL1.

Under these write conditions, in the surface of the impurity regions forming the sub-bit line SBL1, an n-type inversion layer is formed. A source-drain voltage is applied to this inversion layer, hence in this inversion layer the energy bands bend sharply, and the effective band-gap decreases. Consequently, band-to-band tunneling current takes place easily. Electrons transported by the band-to-band tunneling current is accelerated by the source-drain voltage, obtain high energies and become hot electrons. Their moments (magnitude and direction) are maintained, if their kinetic energies are higher than the energy barrier of the bottom film 11, they electrons surmount the energy barrier of the bottom film 11 and are injected into the carrier traps (charge storing means) in the nitride film 12.

In the write operations utilizing band-to-band tunneling current, since generation of hot electrons is confined to the side of the sub-bit line SBL1, charge is injected into a localized region (the first region) right above the sub-bit line SBL1 in the charge storing region.

In the present embodiment, since the bottom insulating film 11 is comprised of an FN tunneling nitride film, in a write operation, the energy barrier that hot electrons should surmount is reduced from the conventional value of 3.2V to about 2.1V, so, high efficiency of hot electron injection is obtained.

In addition, by setting select cells ought to be written and nonselect cells ought not be written using bias conditions, it is possible to perform a page write to all the cells connected to the word line WL1 simultaneously, but in the present embodiment, due to the aforesaid improvement of the injection efficiency, the write current per bit is decreased by one or more than one order of magnitude, enabling to increase the number of cells able to be written in parallel at one time.

In a read operation, according to the write conditions, change the bias so that it is enough to cause the channel to be formed. For example, with the sub-bit line SBL1 grounded, apply a specified negative voltage of −1.5V to the sub-source line SSL1, and a read word line voltage of −2V to the word lines WL1.

In this way, when performing a page read from memory transistors M11, M12, . . . that are connected to the selected word line WL1, a channel is formed in a memory transistor in the erasure state where no electrons are stored in the first-region of the charge storing means, while a channel is not formed in a memory transistor in a write state where electrons are stored in the first region of the charge storing means. Accordingly, a change of potential appears on the main nit linen MBL1, MBL2, . . . when the channel is turned on. The change in voltage is amplified and read out by not shown sense amplifiers etc.

Erasure is performed by extracting charge from the entire channel, or, the side of the sub-bit line SBL1 utilizing the FN tunneling or direct tunneling effects. For example, in the case of extracting electrons held in the charge storing means from the entire channel region by direct tunneling, apply −5V to word lines WL, and 5V to main bit line BL1, and set open the main source lines MSL1, and apply a 5V to the p-well W. In this way, with electrons held in the first region of the charge storing means extracted to the substrate side, erasure of a cell is performed. Here, the erasure speed is about 1 ms.

The same as in FIG. 3, after a write operation is performed to the first region of the charge storing means in the same way as in the first embodiment, same write operation is performed at the side of the sub-bit line SSL.

In the second write operation, the source-drain voltage is reversed to the first write operation. That is, apply 4V to the selected word lines WL, 0V to the substrate. Set open the sub-bit lines SBL, and apply −4V to the sub-source line SSL. Therefore, similar with the first write operation, hot electrons caused by band-to-band tunneling current are injected into the charge storing means at the side of the sub-source line SSL (the second region).

Therefore, in a cell in which two bits are both in write states, hot electrons are injected and held in the first region of the charge storing means, independently, hot electrons are injected and held in the second region. Since there is the third region into which hot electrons are not injected between the first and second regions, electrons corresponding to the two bits of data are able to be unambiguously distinguished.

Read is performed by reversing the direction of the source-drain voltage according to which aide holding binary data corresponding to the stored charge of the first and the second regions is to be read. In this way, two bits of data can be read independently.

Erasure is also performed by reversing the direction of the source and drain (sub-bit line SBL and sub-source line) voltage with respect to that in the aforesaid erasing the first region side. When erasing the entire channel, data in the first and the second regions are erased at one time.

Next, the current-voltage characteristics of the memory transistor were studied in both the write and erasure states.

The results showed that at a drain voltage of 1.5V, the off leakage current from nonselected cells was a small one of about 1 nA. Since in this case the read current is greater than 10 μA, a mistaken read of a nonselected cell does not happen. Thus, it was found there was a sufficient margin of the punch-through voltage in a read operation in a MONOS type memory transistor with a gate length of 0.18 μm.

The road disturbance characteristic with a gate voltage of 1.5V was also evaluated. It was found that even after more than $3\times10^6$ seconds had passed, it was still possible to read the data.

Because the carrier traps are spatially dispersed, the number of possible write-erasure cycles is found to be more than $1\times10^6$.

The data retention characteristic is over 10 years at 85° C. after $1\times10^6$ write-erasure cycles.

From the above results, it was verified that a sufficiently high performance was achieved as an MONOS type nonvolatile memory transistor with a gate length of 0.18 μm. In addition, because the bottom insulating film 11 is formed from the FN tunneling nitride film, it is easy to realize or improve the performance of a MONOS type nonvolatile memory transistor with a gate length of 0.13 μm.

In the fourth embodiment, same effects as in the previous first embodiment can also be achieved because the bottom insulating film 11 is comprised of an FN tunneling insulating film.

That is, in write operations (or erasure operations), the energy barrier with the bottom insulting film 11 that hot electrons (or hot holes) should surmount is reduced comparing with the conventional configuration including a bottom film comprised of an oxide film, thus the efficiency of hot electron injection is improved, and the write drain voltage in reduced from 4.5V to 3.3V in order to achieve the same write speed as the conventional one.

Due to the reduction of drain voltage, increase of the drain current caused by punch-through can be suppressed, resultantly, the scaling of the gate length becomes easy.

Moreover, because lowered write voltages become possible, in write operations, it is not necessary to increase the voltage on the bit lines using a charge-pump circuit, and the time to pre-charge the bit lines is short, accordingly, the operation cycle for writing one page can be shortened. Since two bits can be written into one memory cell, the effective memory cell area per bit is small.

In addition, it in possible to suppress the damage of hot carrier injection to the bottom insulating film.

Note that in an NOR type memory cell array related to the fourth embodiment, each memory cell can be a three-transistor type in which each transistor has a cross section an shown in FIG. 13 or FIG. 14.

Fifth Embodiment

Figure 18:
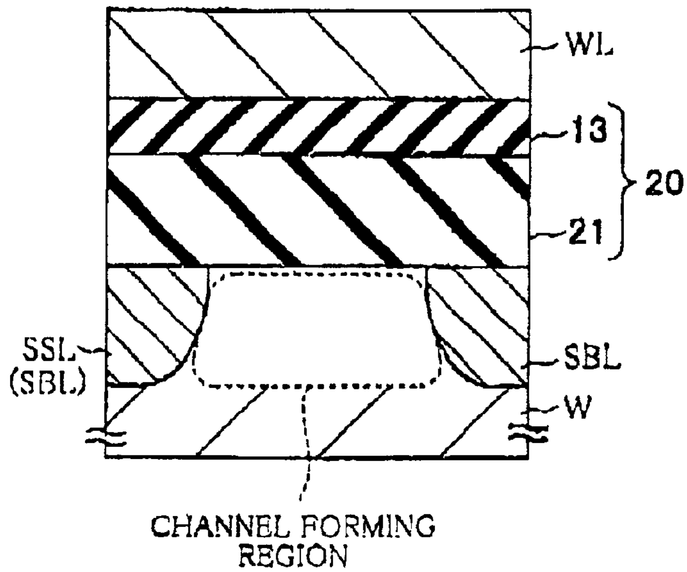
FIG. 18 is a cross-sectional view of a memory transistor according to the fifth embodiment of the present invention.

FIG. 18 is a cross-sectional view of a memory transistor according to the fifth embodiment.

In the gate insulating film 20 of this memory transistor, the bottom insulating film 21 is thickly deposited, and there is not the intermediate nitride film 12 in the first embodiment.

The bottom insulating film 21 is formed in the same way as in the first embodiment. The initial thickness of the formed bottom insulating film 21 is made to be, for example, 6 nm, its surface in then thermally oxidized to form the top insulating film 13. So formed gate insulating film 20 (film thickness specifications are bottom insulating film/top insulating film=3.8/3.5 nm) has an equivalent thickness of 5.4 nm, if converted to the thickness of silicon dioxide film.

Other features in the configuration and methods of formation are the same as the first embodiment. In addition, the basic operations of write, read and erasure are also the same as the first embodiment.

Before depositing the bottom insulating film 21, a thin buffer oxide film may be formed on the surface of silicon in order to reduce the density of surface states on tho silicon surface of the channel forming region.

In the present embodiment, since the bottom insulating film 21 in thickly deposited, and the top insulating film 13 is formed directly thereon, all nitride films are FN tunneling nitride films. Since the carrier trap number in the FN tunneling film is relatively small, the carrier traps near the interface between the nitride film (bottom insulating film 21) and the oxide film (top insulating film 13) are much deeper than in the first embodiment, and they can be efficiently used to store charge. Resultantly, the effective thickness of the gate insulating film 20 is reduced, and it is possible to achieve lower voltages.

Sixth Embodiment

The sixth embodiment relates to a nonvolatile semiconductor memory device using as the charge storing means of a memory transistor a large number of mutually isolated silicon nanocrystals buried in the gate insulating film and having a size of for example below 10 nm (hereinafter referred to as the Si nanocrystal type).

Figure 19:
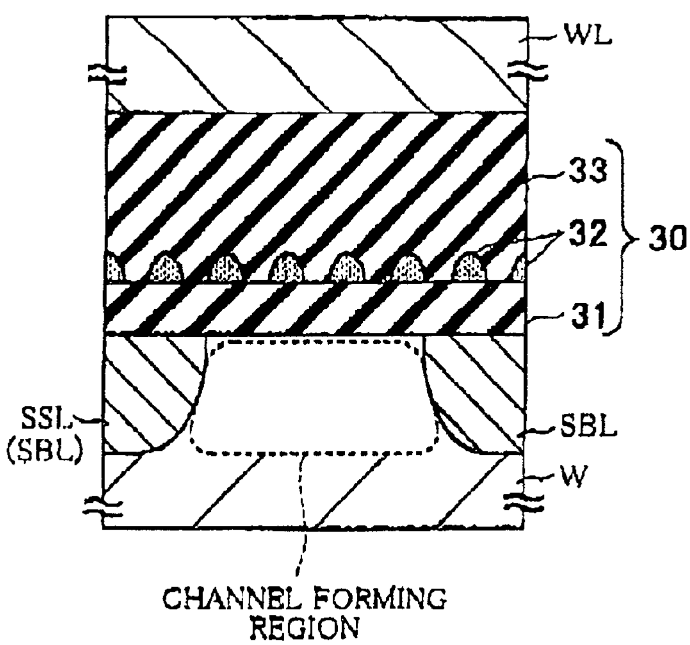
FIG. 19 is a cross-sectional view of a nanocrystal type memory transistor according to the sixth embodiment of the present invention.

FIG. 19 is a cross-sectional view for illustrating the element structure of a silicon nanocrystal type memory transistor.

In the silicon nanocrystal type nonvolatile memory according to the present embodiment, the gate insulating film 30 is comprised of a bottom insulating film 31, silicon nanocrystals 32 thereon used as the charge storing means, and an oxide film 33 covering the silicon nanocrystals 32.

The rest of tho configuration, that is, the semiconductor substrate, channel forming region, well W, sub-source lines SSL (source impurity region), sub-bit lines (drain impurity region or source-drain impurity region), and word lines WL, are the same as those in the first embodiment.

The silicon nanocrystals 32 have a size (diameter) of preferably below 10 nm, for example, about 4.0 nm. The individual Si nanocrystals are separated spatially by the oxide film 33, for example, are at intervals of for example 4 nm or so.

The bottom insulating film 31 in this example is somewhat thicker than in the first embodiment due to the closeness of the charge storing means (Si nanocrystals 32) to the substrate side. The thickness may be suitably selected in the range from 2.6 nm to 5.0 nm in accordance with the application. Here, it is made a thickness of about 4.0 nm.

The memory transistor of this configuration is fabricated by forming the bottom insulating film 31, then forming a number of Si nanocrystals 32 on the bottom insulating film 31 by for example LP-CVD. Further, the oxide film 33 is formed to for example 7 nm by LP-CVD to bury the Si nanocrystals 32. In this LP-CVD, the feedstock gas is a mixture of DCS and $N_2O$ and the substrate temperature is made for example 700° C. At this time, the Si nanocrystals 32 are buried in the oxide film 33 and the surface of the oxide film 33 is flattened. When insufficiently flattened, another flattening processes (for example, CMP) may be performed. Next, the conductive film forming the word lines is formed and the gate stacked film is patterned all together, whereby the Si nanocrystal type memory transistor is completed.

The Si nanocrystals 32 formed in this way function as carrier traps discrete in the planar direction. The trap level can be deduced from the band discontinuity with the surrounding silicon oxide. It is deduced to be about 3.1 eV. Individual Si nanocrystals 32 of this trap level are able to hold several injected electrons. Note that a silicon nanocrystal can also be made smaller to hold a single electron.

The data retention characteristics of a Si nanocrystal type nonvolatile memory of such a configuration was studied by Lundkvist's Back-Tunneling Model. To improve the data retention characteristics, it is important to make the trap level deep and increase the distance between the center of the charge and the semiconductor substrate. Simulations were made to study the data retention characteristics in the case of a trap level of 3.2 eV by using Lundkvist's model as a physical model. It was found that by using deep carrier traps of a trap level of 3.2 eV, a good data retention characteristics is obtained even with a relatively close distance of 4.0 nm from the charge storing medium to the channel forming region.

Seventh Embodiment

The seventh embodiment relates to a nonvolatile semiconductor device using as the charge storing means of the memory transistor a large number of mutually separated fine split floating gates buried in the insulating film (hereinafter referred to as fine split FG type).

Figure 20:
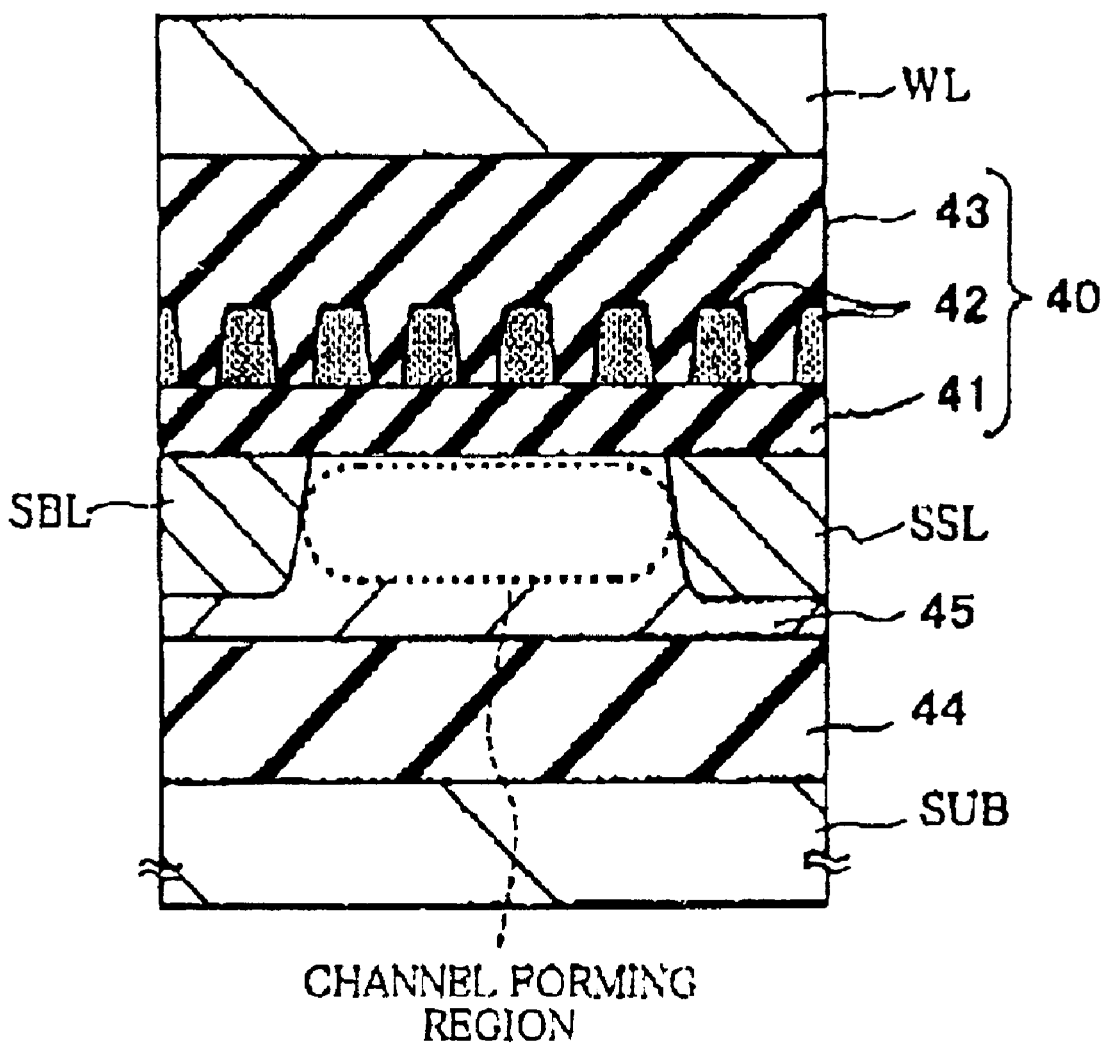
FIG. 20 is a cross-sectional view of a nanocrystal type memory transistor according to the seventh embodiment of the present invention.

FIG. 20 is a cross-sectional view of the element structure of a fine split FG type memory transistor.

In the fine split FG type nonvolatile memory of the 11th embodiment, the memory transistor is formed on an SOI substrate. The gate insulating film 40 is comprised of a bottom insulating film 41, fine split floating gates 42 thereon used as the charge storing means, and an oxide film 43 burying the fine split floating gates 42.

The fine split floating gates 42, along with the Si nanocrystals 32 in the sixth embodiment, are specific examples of "small particle conductors" spoken of in the present invention.

As the SOI substrate, use may be made of a separation-by-implanted-oxygen (SIMOX) substrate comprised of a silicon substrate implanted with oxygen ions at a high concentration to form a buried oxide film at a location deeper than the substrate surface or a bonded substrate consisting of any a substrate and a silicon substrate with an oxide film formed etc. The SOI substrate formed by this method shown in FIG. 20 is comprised of a semiconductor substrate SUB, an isolation oxide film 44, and a silicon layer 45. In the silicon layer 45, sub-source lines SSL (source impurity regions S) and sub-bit lines (drain impurity regions D) are formed. The region between these two impurity regions is the channel forming region.

Instead of the semiconductor substrate SUB, use may also be made of a glass substrate, a plastic substrate, a sapphire substrate, etc.

The fine split floating gates 42 are obtained by processing a normal floating gate into fine poly-Si dots of for example a height of about 5.0 nm and a diameter of up to 8 nm.

The bottom insulating film 41 in the present embodiment is formed much thinner than the normal FG type. The thickness may be suitably selected in the range from 2.5 nm to 4.0 nm in accordance with the application. Here, it is made the thinnest 2.5 nm.

In the fabrication of a memory transistor of this configuration, a bottom insulating film 41 is formed on the SOI substrate, then a polysilicon film (final thickness 5 nm) is formed on the bottom insulating film 41 by for example LP-CVD. In this LP-CVD, the feedstock gas is a mixture of DCS and ammonia and the substrate temperature is made for example 650° C. Next, for example, electron beam lithography is used to process the polysilicon film into fine polysilicon dots of a diameter of for example up to 8 nm. The polysilicon dots function as the fine split type floating gates 42 (the charge storing means). Then, an oxide film 43 is formed to a thickness of for example up to 9 nm by LP-CVD to bury the fine split type floating gates 42. In this LP-CVD, the feedstock gas is a mixture of DCS and $N_2O$, the substrate temperature is made for example 700° C. At this stage, the fine split typo floating gates 42 are buried in the oxide film 43 and the surface of the oxide film 43 is flattened. If the flattening is insufficient, another flattening process (for example, CMP) may be performed. Next, the conductive film forming the word lines is formed and the gate stacked films are patterned, thereby completing the fine split FG type memory transistor.

Concerning the effects of using an SOI substrate and splitting a floating gate into fine dots, elements were fabricated in the manner described above and evaluated for performance. It was verified that good performances as predicted were obtained.

Modifications

While the invention has been described with reference to specific embodiment chosen for purpose of illustration, it should be apparent that numerous modifications could be made thereto by those skilled in the art without departing from the basic concept and scope of the invention.

Specifically, various modifications may be made to the first to the seventh embodiments described above.

In the present invention, as methods of hot electron injection in write operations, injection of channel hot electron including injection of hot electrons caused by band-to-band tunneling current and source-side injection are illustrated. In the present invention, other injection methods may also be adopted, such as injection of ballistic hot electrons that involves moving electrons ballistically in the channel, and injection of secondarily generated hot electrons, as well as injection of substrate hot electrons.

The present invention is also applicable to other kinds of NOR type cells, such as the DINOR type, which are not illustrated, and further AND type cells.

In addition to a stand alone type nonvolatile memory, the present invention is also applicable to an embedded non-volatile memory provided with logic circuits integrated on the same substrate.

Summarizing the effects of the present invention, according to the nonvolatile semiconductor memory device and the method for operating the name, because the bottom insulating film in comprised of a dielectric film lowering the energy barrier with silicon, or a multi-layer structure including such a dielectric film, the energy barrier that electrons should surmount during hot electron injection, is reduced, and hence the injection efficiency is improved. Accordingly, in addition to an increase of write speed, there appears room for decreasing the drain voltage, thus, a punch-through is hard to occur, and reducing the gate length becomes easy.

In addition, due to the reduced drain voltage, the time to pre-charge the bit lines can be shortened, accordingly, the operation cycle for writing can be shortened. On the other hand, since the bottom insulating film can be made thin and accordingly the effective thickness of the gate insulating film can also be made thin, it becomes easy to lower the voltage applied on a gate. With a lowered drain voltage, the damage to the bottom insulating film is suppressed, resulting in higher reliability.

Furthermore, if charges are locally stored into the source side and drain side of the charge storing means separately, it is possible to store a plurality of bits of data in one memory cell.

What in claimed is:

1. A nonvolatile semiconductor memory device comprising:

- a substrate;
- a semiconductor channel forming region in the vicinity of the surface of the substrate;
- a first and a second impurity regions formed in the vicinity of the surface of the substrate sandwiching the channel forming region between them, acting as a source and a drain in operation;
- a gate insulating film stacked on the channel forming region, and comprised of a plurality of films;
- a gate electrode formed on the gate insulating film;
- a charge storing means which is formed in the gate insulating film dispersed in the plane facing the channel forming region and in the direction of thickness and is injected with excited hot electrons in operation due to an electric field applied; and
- wherein a bottom insulating film positioned at the bottom in said gate insulating film comprises
- a dielectric film that makes an energy barrier between the bottom insulating film and the substrate lower than that between silicon dioxide and silicon.

2. A nonvolatile semiconductor memory device as set forth in claim 1, wherein said bottom insulating film comprises a dielectric film that makes an energy barrier between the bottom insulating film and the substrate lower than that between silicon and an oxynitride film formed after silicon dioxide is nitrided.

3. A nonvolatile semiconductor memory device as set forth in claim 2, wherein the percentage of nitrogen content in said oxynitride film is not greater than 10%.

4. A nonvolatile semiconductor memory device as set forth in claim 1, wherein in a write or erasure state, said charge storing means in primarily injected with anyone of channel hot electrons, ballistic hot electrons, secondarily generated hot electrons, substrate hot electrons, and hot electrons caused by band-to-band tunneling current.

5. A nonvolatile semiconductor memory device as set forth in claim 1, wherein said dielectric film included in said bottom insulating film exhibits a Fowler-Nordheim (FN) type tunneling electroconductivity.

6. A nonvolatile semiconductor memory device as set forth in claim 1, wherein said bottom insulating film includes said dielectric film comprised of anyone or a combination of a silicon nitride film, a silicon oxynitride film, a tantalum oxide film, a zirconium oxide film, an aluminum oxide film, a titanium oxide film, a hafnium oxide, a barium strontium titanium oxide, and an yttrium oxide film.

7. A nonvolatile semiconductor memory device as set forth in claim 1, wherein, said gate insulating film comprises a nitride film or an oxynitride film exhibiting a Frenkel-Pool (FP) type electroconductivity on said bottom insulating film.

8. A nonvolatile semiconductor memory device an set forth in claim 1, wherein said gate insulating film comprises:

- a first region into which the hot electrons are injected from said first impurity region;
- a second region into which the hot electrons are injected from said second impurity region; and
- a third region between the first and the second impurity regions into which the hot electrons are not injected.

9. A nonvolatile semiconductor memory device as set forth in claim 1, wherein said gate insulating film comprises:

- a first region at the side of said first impurity region;
- a second region at the side of said second impurity region; and
- a third region between the first and the second region,
- wherein said charge storage means is formed in the first and the second regions; and
- wherein the distribution region of the charge storing means is spatially separated by the third region.

10. A nonvolatile semiconductor memory device as set forth in claim 9, wherein

- said first and second regions are stacked film structures comprised of a number of films stacked together, and
- said third region is a single layer of a dielectric.

11. A nonvolatile semiconductor memory device as set forth in claim 9, wherein a gate electrode formed on said third region is spatially separated from gate electrodes formed on said first region and second regions.

12. A nonvolatile semiconductor memory device as set forth in claim 1, comprising:

- a plurality of memory transistors each of which including said channel forming region, said first and second impurity regions, said gate insulating film, and said gate electrodes, and arranged in both a word line direction and a bit line direction;
- a plurality of word lines; and
- a plurality of common lines which intersect with the plurality of word lines in an electrically insulated state,
- wherein the plurality of gate electrodes are respectively connected to the plurality of word lines; and
- wherein the plurality of the first and second impurity regions are coupled with the plurality of common lines.

13. A nonvolatile semiconductor memory device as set forth in claim 12, comprising:

word lines commonly connecting said gate electrodes in a word line direction;

first common lines commonly connecting said first impurity regions in a bit line direction; and second common lines commonly connecting said second impurity regions.

14. A nonvolatile semiconductor memory device as net forth in claim 13, wherein:

said first common lines include first sub-lines commonly connecting said first impurity regions in a bit line direction and first main lines commonly connecting the first sub-lines in a bit line direction;

said second common lines include second sub-lines commonly connecting said second impurity regions and second main lines commonly connecting the second sub-lines; and said plurality of memory transistors are connected in parallel between the first sub-lines and the second sub-lines.

15. A nonvolatile semiconductor memory device as set forth in claim 1, wherein said charge storing means does not have conductivity as a plane as a whole facing said channel forming region at least when there is not dissipation of charge in the outside.

16. A nonvolatile semiconductor memory device as set forth in claim 15, wherein said gate insulating film comprises:

a bottom insulating film on said channel forming region;

a nitride film or an oxynitride film on said bottom insulating film; and a top insulating film on said nitride film or oxynitride film.

17. A nonvolatile semiconductor memory device as set forth in claim 15, wherein said gate insulating film comprises:

a bottom insulating film on said channel forming region, and a top insulating film on said bottom insulating film.

18. A nonvolatile semiconductor memory device an set forth in claim 17, wherein the Si—H bond density in the bottom insulating film is lower than that in the nitride film that shows a FP type electroconductivity and constitutes said top insulating film.

19. A nonvolatile semiconductor memory device as set forth in claim 18, wherein the Si—H bond density in the bottom insulating film is lower than 1×1020 atms/$mm^3$.

20. A nonvolatile semiconductor memory device as set forth in claim 19, wherein the Si—H bond density in the bottom insulating film is by more than one order of magnitudes lower than that in the nitride film showing a FP type electroconductivity and constituting said top insulating film.

21. A nonvolatile semiconductor memory device as set forth in claim 17, wherein said bottom insulating film comprises a buffer oxide film on said channel forming region and a dielectric film that is formed on said buffer oxide film and is comprised of a material having a dielectric constant greater than that of silicon dioxide.

22. A nonvolatile semiconductor memory device as set forth in claim 17, wherein said bottom insulating film comprises:

a dielectric film formed on said channel forming region and comprised of a material having a dielectric constant greater than that of silicon dioxide and a silicon dioxide film formed on the dielectric film.

23. A nonvolatile semiconductor memory device as set forth in claim 15, wherein said gate insulating film comprises:

a bottom insulating film on said channel forming region and mutually insulated small particle conductors formed on the bottom film and functioning as said charge storing means.

24. A nonvolatile semiconductor memory device as set forth in claim 23, wherein said small particle conductors are of diameters not greater than 10 nanometers.

25. A nonvolatile semiconductor memory device comprising:

a substrate;

a semiconductor channel forming region in the vicinity of the surface of the substrate;

a first and a second impurity regions formed in the vicinity of the surface of the substrate sandwiching the channel forming region between them, acting as a source and a drain in operation;

a gate insulating film stacked on the channel forming region and comprised of a plurality of films;

a gate electrode formed on the gate insulating film; and a charge storing means which in formed in said gate insulating film dispersed in the plane facing said channel forming region and in the direction of thickness and is primarily injected in operation with channel hot electrons, ballistic hot electrons, secondarily generated hot electrons, substrate hot electrons, and hot electrons caused by band-to-band tunneling current, and wherein a bottom insulating film positioned at the bottom in the gate insulating film comprises a dielectric film of a material having a dielectric constant greater than that of silicon dioxide.

26. A nonvolatile semiconductor memory device as set forth in claim 25, wherein the Si—H bond density in said bottom insulating film is lower than that in a nitride film showing a FP type electroconductivity and constituting said gate insulating film.

27. A nonvolatile semiconductor memory device as set forth in claim 26, wherein the Si—H bond density in said bottom insulating film is lower than 1×1020 atms/$mm^3$.

28. A nonvolatile semiconductor memory device as set forth in claim 27, wherein the Si—H bond density in said bottom insulating film is by more than one order of magnitudes lower than that in a nitride film showing a FP type electroconductivity and constituting said gate insulating film.

29. A nonvolatile semiconductor memory device comprising:

a substrate;

a semiconductor channel forming region in the vicinity of the surface of the substrate;

a first and a second impurity regions formed in the vicinity of the surface of the substrate sandwiching the channel forming region between them, acting as a source and a drain in operation;

a gate insulating film stacked on the channel forming region and comprised of a plurality of films;

a gate electrode formed on the gate insulating film; and a charge storing means which is formed in said gate insulating film dispersed in the plane facing said channel forming region and in the direction of thickness and in primarily injected in operation with channel hot electrons, ballistic hot electrons, secondarily generated hot electrons, substrate hot electrons, and hot electrons caused by band-to-band tunneling current, wherein the gate insulating film comprises:

a first region at the side of the first impurity region;

a second region at the side of the second impurity region; and a third region between the first and the second regions, wherein said charge storage means is formed in the first and the second regions; and wherein the distribution region of the charge storing means is spatially separated by the third region.

30. A nonvolatile semiconductor memory device as set forth in claim 29, wherein said first and second region are stacked film structures comprised of a number of films stacked together, and said third region in a single layer of a dielectric.

* * * * *

UNITED STATES PATENT AND TRADEMARK OFFICE

CERTIFICATE OF CORRECTION

PATENT NO. : 6,949,788 B2
APPLICATION NO. : 09/735903
DATED : September 27, 2005
INVENTOR(S) : Ichiro Fujiwara It is certified that error appears in the above-identified patent and that said Letters Patent is hereby corrected as shown below:

Column 28,
Line 3, "means in" should read -- means is --.

Column 30,
Line 24, "which in" should read -- which is --.

Column 31,
Line 4, "in" should read -- is --.

Column 31,
Line 4, "in" should read -- is --.

Column 32,
Line 8, "region" should read -- regions --.
Line 10, "in" should read -- is --.

Signed and Sealed this

Fourth Day of July, 2006

JON W. DUDAS
*Director of the United States Patent and Trademark Office*